(12) United States Patent
Harada et al.

(10) Patent No.: US 7,728,431 B2
(45) Date of Patent: Jun. 1, 2010

(54) ELECTRONIC COMPONENT, SEMICONDUCTOR DEVICE EMPLOYING SAME, AND METHOD FOR MANUFACTURING ELECTRONIC COMPONENT

(75) Inventors: Yoshimichi Harada, Kanagawa (JP); Akiyoshi Aoyagi, Kanagawa (JP); Hiroshi Asami, Shizuoka (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/810,070

(22) Filed: Jun. 4, 2007

(65) Prior Publication Data
US 2007/0290343 A1    Dec. 20, 2007

(30) Foreign Application Priority Data
Jun. 15, 2006    (JP)    ............................ P2006-165722

(51) Int. Cl.
    *H01L 23/48*    (2006.01)

(52) U.S. Cl. ................. 257/750; 438/612; 257/E21.169

(58) Field of Classification Search ................. 257/750, 257/751, 753, 762–764, 766–772, 774, E21.169; 438/611–614
See application file for complete search history.

(56) References Cited

U.S. PATENT DOCUMENTS 5,298,459 A * 3/1994 Arikawa et al. ............. 438/614
7,176,583 B2 * 2/2007 Daubenspeck et al. ...... 257/781

FOREIGN PATENT DOCUMENTS

| JP | 54-111761 | 9/1979 |
|----|-----------|--------|
| JP | 54-113248 | 9/1979 |
| JP | SHO54-111761 | 9/1979 |
| JP | SHO54-113248 | 9/1979 |
| JP | 10-092830 | 4/1998 |
| JP | 10-189606 | 7/1998 |
| JP | 10-189635 | 7/1998 |
| JP | HEI10-189606 | 7/1998 |
| JP | 10-247651 | 9/1998 |
| JP | HEI10-247651 | 9/1998 |
| JP | 2004-228295 | 8/2004 |
| JP | 2004-349536 | 12/2004 |
| JP | 2005-116885 | 4/2005 |
| JP | 2005-183641 | 7/2005 |
| JP | 2005-322705 | 11/2005 |

* cited by examiner

*Primary Examiner*—David Vu
(74) *Attorney, Agent, or Firm*—Robert J. Depke; Rockey, Depke & Lyons, LLC

(57) ABSTRACT

Herein disclosed an electronic component having a passivation layer in which an opening that exposes a part of a pad electrode is formed, an underlying metal layer formed on the pad electrode and the passivation layer, and a barrier metal layer formed on the underlying metal layer for an external connection electrode, the electronic component including a recess or/and a projection configured to be provided under the barrier metal layer outside or/and inside the opening, the underlying metal layer being formed on the recess or/and the projection and having a surface shape that follows the recess or/and the projection.

2 Claims, 18 Drawing Sheets

FIRST EMBODIMENT
BUMP ELECTRODE FORMATION WITH SUPPRESSED INFLUENCE OF SIDE ETCHING

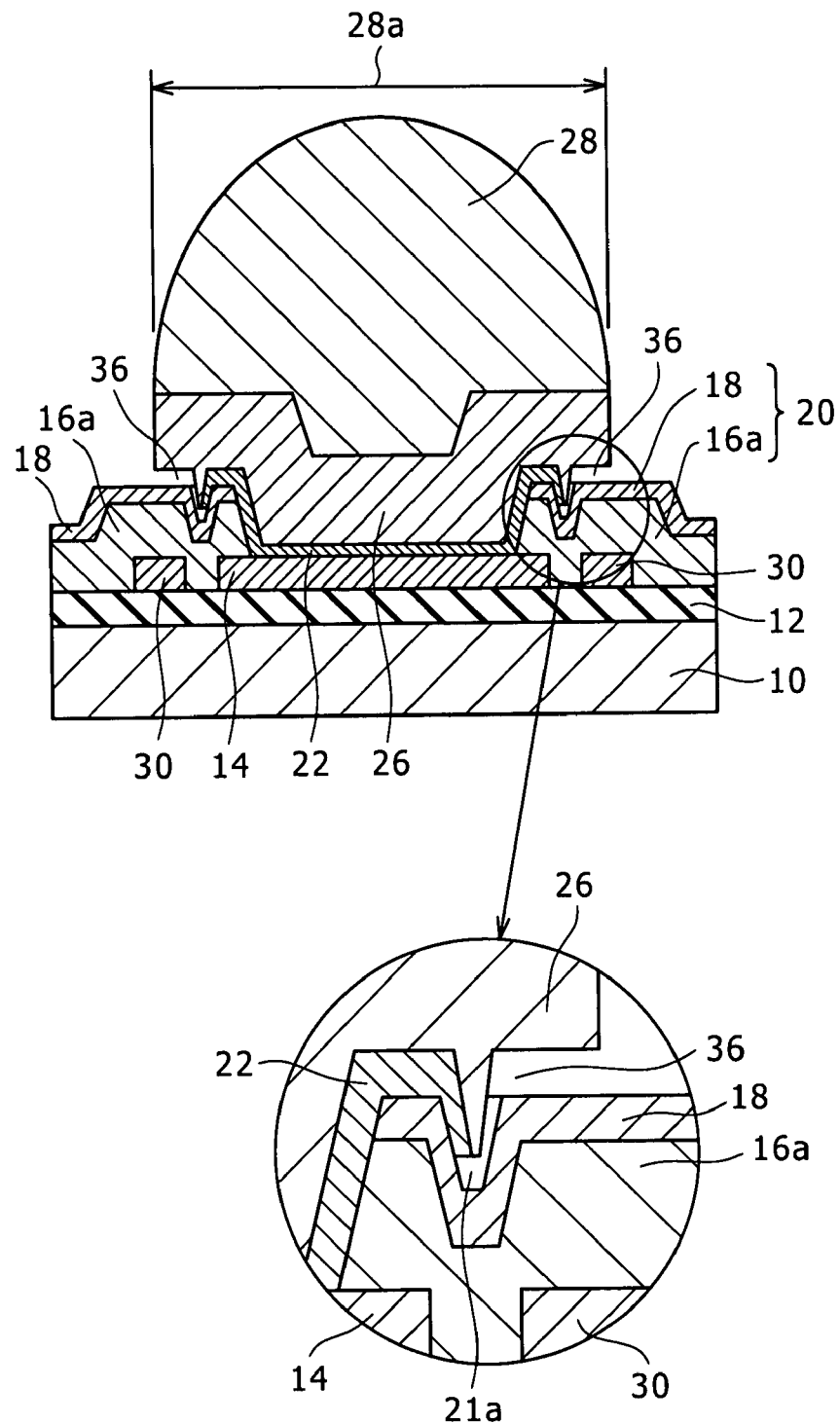

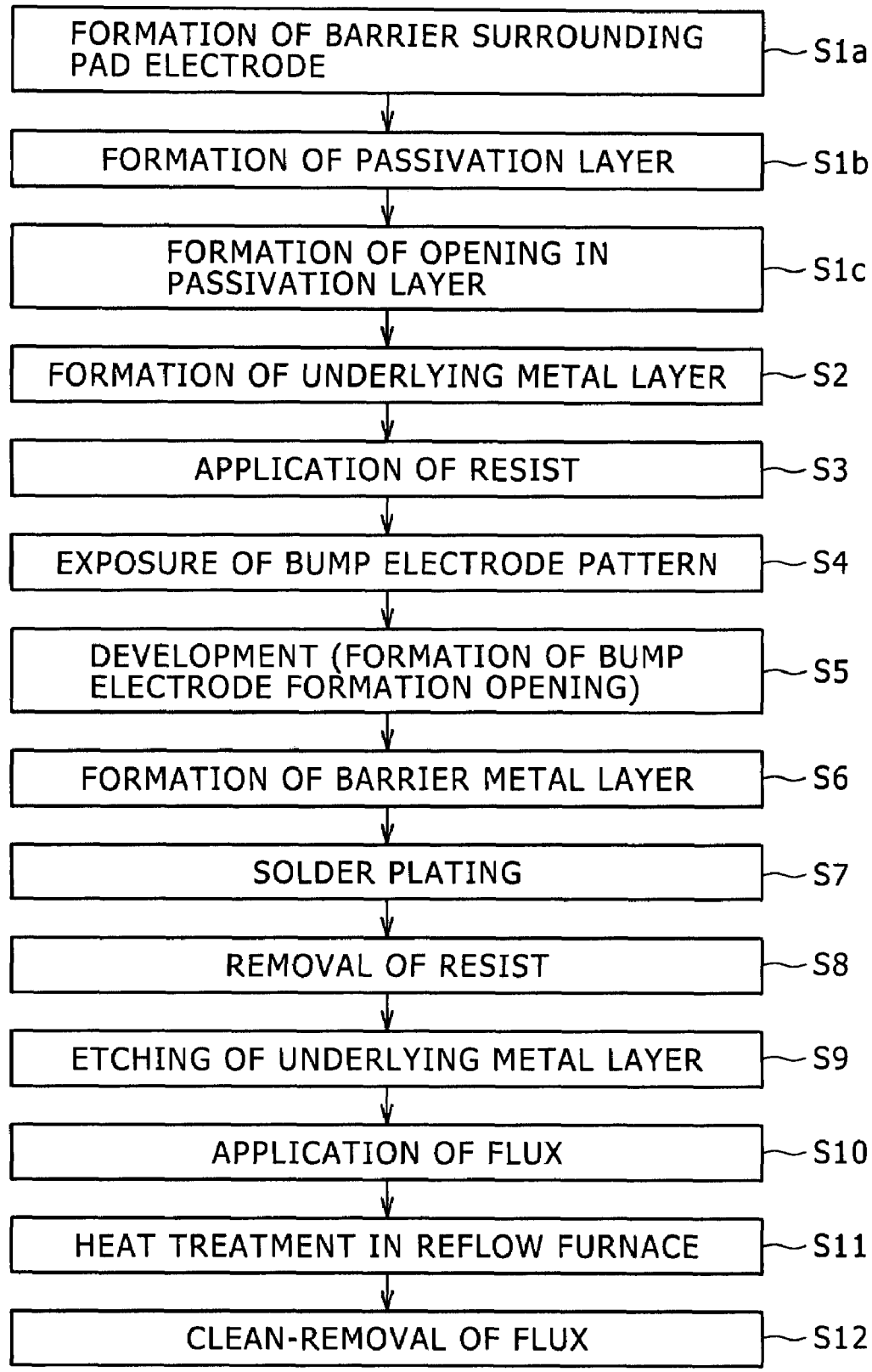

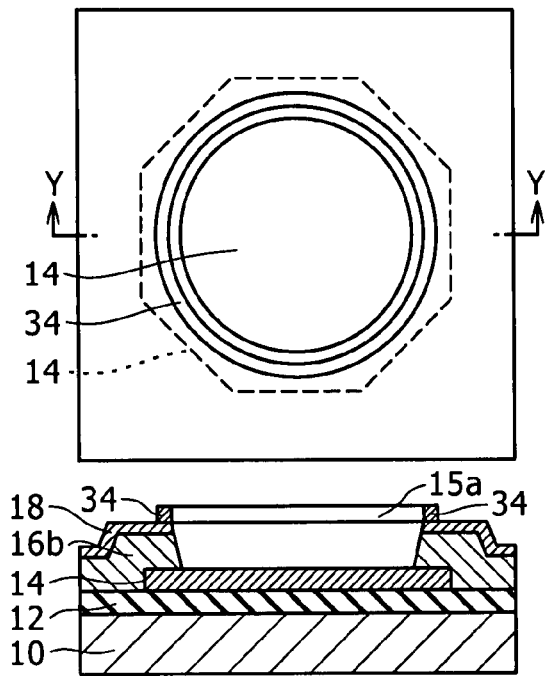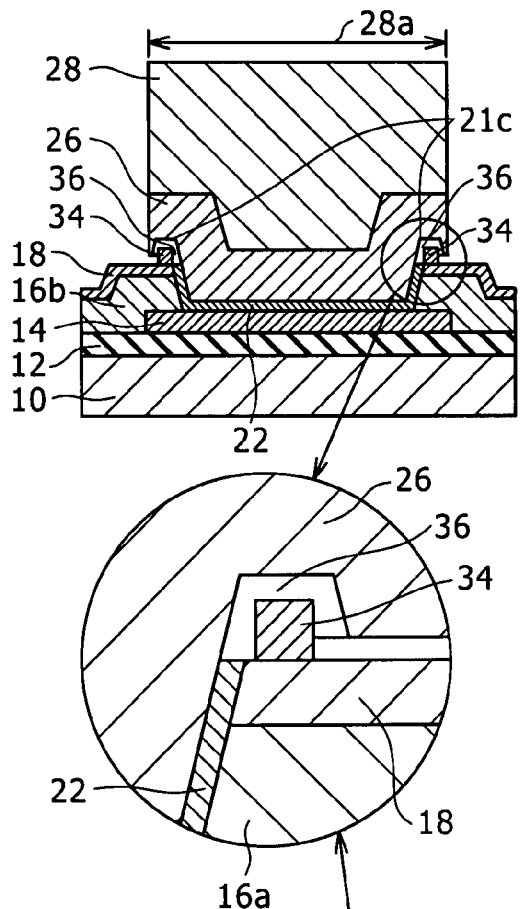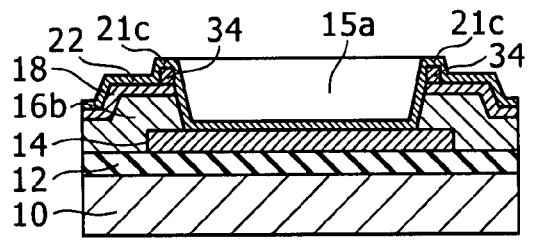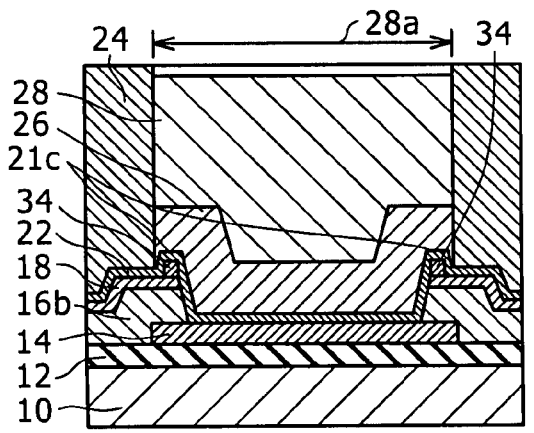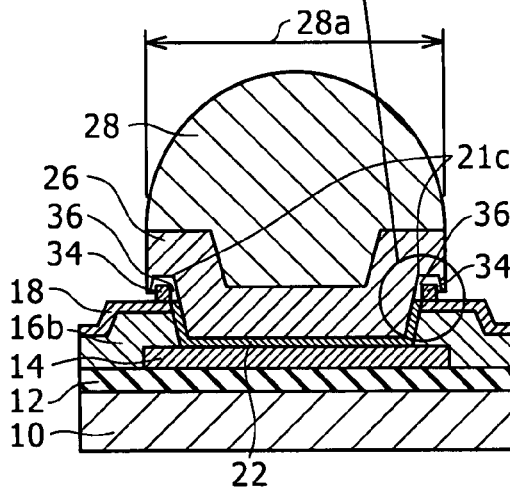

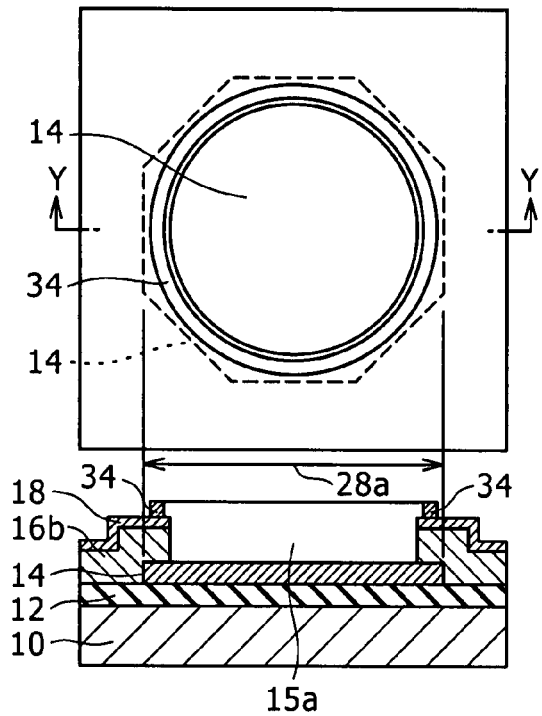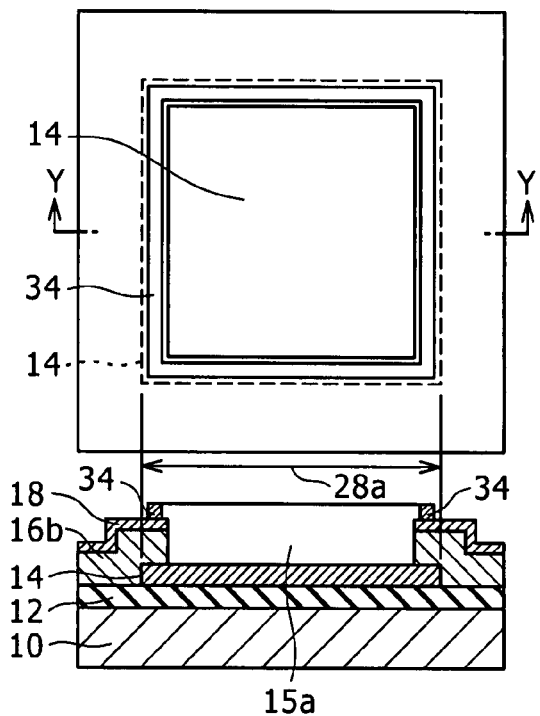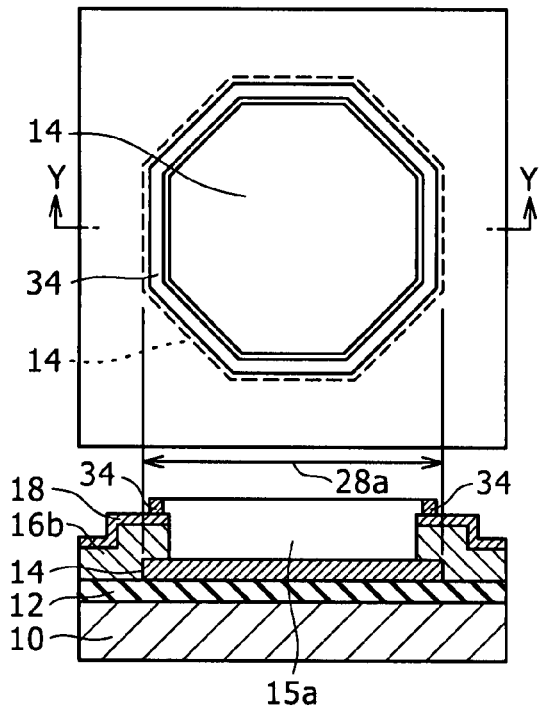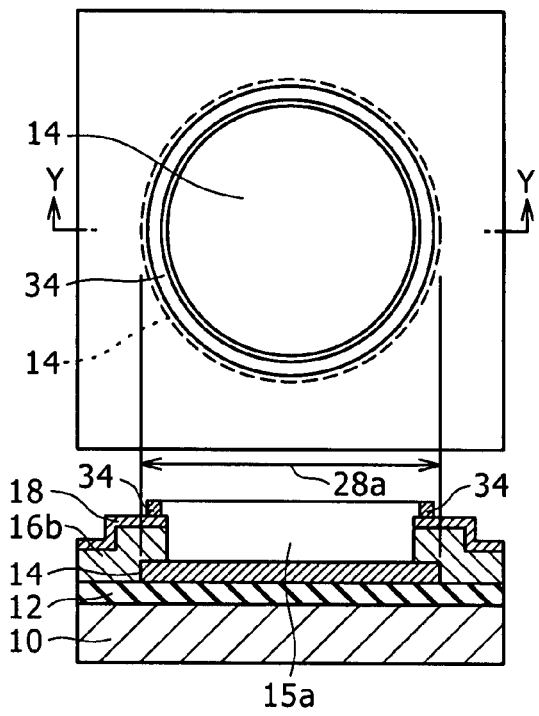

ELECTRONIC COMPONENT, SEMICONDUCTOR DEVICE EMPLOYING SAME, AND METHOD FOR MANUFACTURING ELECTRONIC COMPONENT

CROSS REFERENCES TO RELATED APPLICATIONS

The present invention contains subject matter related to Japanese Patent Application JP 2006-165722 filed with the Japan Patent Office on Jun. 15, 2006, the entire contents of which being incorporated herein by reference.

BACKGROUND OF THE INVENTION

1. Field of the Invention

The present invention relates to electronic components and methods for mounting the same, and particularly to an electronic component having an external connection electrode that allows highly reliable electric connection because of prevention of the lowering of the bonding strength between the external connection electrode and a substrate, arising due to side etching (undercut) at the time of removal of the unnecessary part of an underlying metal layer by wet etching. The invention relates also to a semiconductor device employing this electronic component, and a method for manufacturing an electronic component.

2. Description of the Related Art

There are very strong demands for electronic apparatuses typified by mobile products such as cell phones to have higher density, smaller size, higher performance, and higher reliability. Various kinds of mounting technique are being studied in order to meet these demands.

Along with enhancement of the integration degree and performance of LSIs, the chip size is ever-increasing, which leads to serious problems such as the lowering of the yield and increases in the mounting area and costs. In recent years, attention has been paid on SiP (System in Package), which can address these problems and offer higher LSI performance simultaneously. The SiP can be classified into various structures such as a package-stack structure, chip-stack structure, and chip-on-chip structure. Of these structures, the chip-on-chip structure is advantageous in achievement of higher speed and lower power consumption because it can interconnect chips with a short interconnect length.

The chip-on-chip SiP is realized by connecting e.g. a memory chip and a logic circuit chip to each other via bumps formed on the chips in such a way that the active surfaces of the chips are in face-to-face. A large number of reports on formation of bumps have been issued.

Japanese Patent Laid-open No. Hei 10-189635 (hereinafter Patent Document 1, Paragraphs 0006 to 0008, FIG. 2) titled "Handoutai souchi no setsugou houhou" ("Bonding method for semiconductor device" in English) includes the following description.

FIGS. 15A to 15E are equivalent to FIG. 2 in Patent Document 1, and are sectional views showing the respective forming steps for a semiconductor device having a bump electrode.

With reference to FIGS. 15A to 15E, a method for forming an external electrode 116 over a silicon wafer 110 will be described below. Referring initially to FIG. 15A, an internal electrode 111 and an insulating film 112 composed of a silicon oxide are formed on the silicon wafer 110, and then an electrode pad 113 composed of aluminum or an aluminum alloy is formed thereon. Subsequently, an insulating film 114 composed of a silicon nitride is formed on the electrode pad 113 and the insulating film 112. In the insulating film 114, an opening 114a of which size is slightly smaller than the outline size of the electrode pad 113 is formed by etching, so that the electrode pad 113 is exposed from the opening 114a. In this state, an under-bump layer composed of an alloy such as a titanium-tungsten alloy and a gold film are sequentially deposited by sputtering, so that an under-bump layer 115 and a gold thin film 116a are formed to each have a thickness of several thousand angstroms over the entire surfaces of the electrode pad 113 and the insulating film 114 over the silicon wafer 110. The thickness of the gold thin film 116a may be several hundred angstroms. In this case, sputtering is the optimum method for uniformly disposing metal particles. Before this film deposition, treatment for removing an aluminum oxide film is carried out according to need.

Referring next to FIG. 15B, a photoresist chemical is dropped on the gold thin film 116a and spin-coating is carried out, so that a thick photoresist film 119 (having a thickness of about 20 to 30 µm) is formed. Subsequently, the formed photoresist film 119 is dried, and then a mask (not shown) is aligned with the top face of the photoresist film 119. The size of the optically-transparent part of this mask is such that the outer peripheral edge of the optically-transparent part is positioned between the outer peripheral edge of the electrode pad 113 and that of the opening 114a in the insulating film 114. The photoresist film 119 is subjected to exposure through this mask and developed by a developer, to thereby form an opening 119a in the photoresist film 119 as shown in FIG. 15C. Subsequently, gold is deposited by electrolytic plating on the gold thin film 116a exposed through the opening 119a to thereby form a bump electrode 116b. The deposition of the bump electrode 116b is stopped before the top face level of the bump electrode 116b becomes higher than that of the photoresist film 119, so that the thickness of the bump electrode 116b is set to about 20 to 30 µm. As a result, the bump electrode 116b has a column shape and a substantially flat top face.

Subsequently, as shown in FIG. 15D, the photoresist film 119 is removed by an organic solvent. In this state, the gold thin film 116a is etched by an iodine etchant, so that the unnecessary part of the gold thin film 116a, i.e., the part of the gold thin film 116a not corresponding to the bump electrode 116b, is removed. The resultant state is shown in FIG. 15E.

A document titled "Bump mekki souchi" ("Bump plating apparatus" in English, Kuriyama et al., Ebara Engineering Review, No. 207, p. 34-38 (2005-4), (Section 3. Bump process, FIG. 1), hereinafter Patent Document 1) includes a description relating to a solder bump plating process as a representative example of bump formation schemes.

Japanese Patent Laid-open No. 10-92830 (hereinafter Patent Document 2, Paragraphs 0006 to 0008, FIGS. 1 and 2) titled "Handoutai souchi no seizou houhou" ("Manufacturing method for semiconductor device" in English) includes the following description.

FIGS. 16A to 16F are equivalent to FIGS. 1 and 2 in Patent Document 2, and are sectional views showing a manufacturing method for a semiconductor device.

With reference to FIGS. 16A to 16F, steps of a manufacturing method for a semiconductor device according to the first embodiment described in Patent Document 2 will be described below.

Step of FIG. 16A:

An oxide film 212 is formed on a semiconductor substrate 211 by CVD, and then a semiconductor device such as an LCD driver IC is formed. An Al film is formed on the entire surface by sputtering or the like and the Al film is patterned through photolithography and etching, so that an Al electrode pad 213 having a size of e.g. about 50 μm×70 μm is formed at the position over which a bump electrode is to be formed. An insulating film composed of $SiO_2$ or the like is formed on the entire surface by CVD, to thereby form a surface protective film 214 to a film thickness of e.g. about 0.8 to 1.4 μm. Subsequently, the surface protective film 214 on the Al electrode pad 213 is removed by photolithography and etching, so that a through hole 15 is opened on the Al electrode pad 213.

Step of FIG. 16B:

Plural underlying metal layers are sequentially deposited over the entire surface of the semiconductor substrate 211 by sputtering or the like. As the underlying metal layers, a Ti/W film 216a showing good adhesion to Al and a Pd film 216b for preventing diffusion of Au are deposited for example.

Step of FIG. 16C:

Over the Ti/W and Pd underlying metal layers 216a and 216b, a positive photosensitive resin film is deposited across the entire surface to a film thickness of about 25 to 30 μm. Subsequently, the part of the photosensitive resin film on the Al electrode pad 213 is subjected to exposure with use of a mask, and then is immersed in an etchant solvent for the photosensitive resin film, so that the exposed part is etched (developed). This process forms a bump electrode formation pattern 217 that has an absent part having a size of about 30 μm×50 μm and positioned above the Al electrode pad 213 and inside the Al electrode pad 213 by a distance of about 20 μm. Subsequently, a bump electrode 218 having a height of e.g. about 15 to 20 μm is formed through Au plating. In this Au plating, with use of the Ti/W and Pd underlying metal layers 216a and 216b as a common cathode, a constant current with a current density of e.g. about 1 $A/cm^2$ is supplied to the semiconductor substrate 211 with the semiconductor substrate 211 immersed in a plating solution such as a potassium gold cyanide or sodium gold sulfite solution.

Step of FIG. 16D:

The part of the photosensitive resin film with a width of e.g. about 5 μm around the absent part of the bump electrode formation pattern 217 is subjected to exposure with use of a mask, and then is immersed in an etchant solvent for the photosensitive resin film, so that the exposed part is etched. This process forms a pattern 217a for forming an underlying-metal protective layer. Each dimension size of the pattern 217a is larger by about 5 μm than that of the bump electrode formation pattern 217.

Step of FIG. 16E:

For Au plating again, with use of the Ti/W and Pd underlying metal layers 216a and 216b as a common cathode, a constant current (e.g., 1 $A/cm^2$) is supplied to the semiconductor substrate 211 with the substrate 211 immersed in a plating solution. Through this Au plating, an underlying-metal protective layer 219 having a film thickness of 1 μm or less (this film thickness is determined depending on the film thicknesses of the Ti/W and Pd underlying metal layers 216a and 216b) is formed in the gap surrounding the bump electrode 218. Through this plating, the same Au film is formed also on the bump electrode 218.

Step of FIG. 16F:

The photosensitive resin film 217 is removed by a removal solvent or the like. Furthermore, with use of the underlying-metal protective layer 219 as a mask, the Pd and Ti/W underlying metal layers 216b and 216a are immersed in an etchant solution so as to be removed by wet etching. Thereafter, the underlying-metal protective layer 219 is etch-removed according to need, so that a final bump electrode structure is obtained. Because the Pd underlying metal layer 216b is covered by the underlying-metal protective layer 219, the part of the Pd and Ti/W underlying metal layers 216b and 216a side-etched at the time of the wet etching thereof is located outside the region directly beneath the bump electrode 218. Therefore, the Pd underlying metal layer 216b under the bump electrode 218 is not etched. After the formation of this bump electrode structure, an inner lead of a tape carrier is connected to the bump electrode 218 through inner lead bonding, which is the end of the mounting.

As described above, according to the first embodiment described in Patent Document 2, the underlying-metal protective layer 219 is provided on the surface of the Pd underlying metal layer 216b around the bump electrode 218 and on the entire surface of the bump electrode 218. This prevents the occurrence of a phenomenon in which at the time of the etching of the Ti/W underlying metal layer 216a, the Ti/W and Pd underlying metal layers 216a and 216b are etched to a part under the bump electrode 218. This phenomenon is referred to as side etching. Thus, it is possible to always keep constant the bonding area between the bump electrode 218 and the Ti/W and Pd underlying metal layers 216a and 216b, which will enhance the quality and yield of the forming step for the bump electrode 218.

Japanese Patent Laid-open No. 2005-322705 (hereinafter Patent Document 3, Paragraphs 0005 to 0012, FIGS. 3 to 7) titled "Handoutai wafer oyobi handoutai chip narabini sorerano seizou houhou" ("Semiconductor wafer, semiconductor chip, and manufacturing method for them" in English) includes the following description.

FIGS. 17A to 17G are equivalent to FIGS. 3 to 7 in Patent Document 3, and are sectional views showing a manufacturing method for a semiconductor wafer, including formation of a bump on a metal layer.

With reference to FIGS. 17A to 17G, steps of a manufacturing method for a semiconductor wafer according to an embodiment described in Patent Document 3 will be described below.

The manufacturing method for a semiconductor wafer according to an embodiment described in Patent Document 3 includes formation of a bump 330 on a metal layer 320 (see FIG. 17C). The bump 330 is formed on an uppermost metal layer 324. The bump 330 is formed to overlap with an opening 318. The bump 330 is formed in a region inside the opening 318. In the manufacturing method for a semiconductor wafer according to an embodiment described in Patent Document 3, the bump 330 is formed in an electrolytic plating step. For example, as shown in FIG. 17A, a mask 335 is formed over a semiconductor substrate 310. The mask 335 has an opening 336 that overlaps with the opening 318 of a passivation layer 316. As shown in FIG. 17A, the opening 336 may be formed in a region inside the opening 318. The mask 335 having the opening 336 may be formed by providing a mask material on the entire surface of the metal layer 320 (the uppermost metal layer 324) and then carrying out exposure and development.

After the formation of the mask 335, an electrolytic plating step is carried out to form the bump 330 inside the opening 336 as shown in FIG. 17B. The material of the bump 330 is not particularly limited. The bump 330 may be formed of e.g. Au. As shown in FIG. 17B, the bump 330 may be monolithic with the uppermost metal layer 324. After the formation of the bump 330, as shown in FIG. 17C, the mask 335 is removed to complete the bump 330. The mask may be so formed that the opening thereof has the same outline shape as that of the opening 318 of the passivation layer 316. By using such a mask, the bump 330 may be so formed that the sectional shape thereof is the same as the shape of the opening 318 of the passivation layer 316 (not shown).

The manufacturing method for a semiconductor wafer according to an embodiment described in Patent Document 3 includes removal of the part of the metal layer 320 other than a lowermost metal layer 322, outside the bump 330 in an etching step as shown in FIG. 17D. In the example shown in FIG. 17D, the part of the uppermost metal layer 324 outside the bump 330 is removed. If another metal layer is formed between the lowermost metal layer 322 and the uppermost metal layer 324, the part of this metal layer outside the bump 330 is also removed. For the removal, an etching step may be carried out with use of the bump 330 as the mask. Using the bump 330 as the mask eliminates the need for a step of providing a mask separately, and thus allows a semiconductor wafer to be manufactured efficiently. In the present step, the etching is so carried out that the lowermost metal layer 322 is not removed. That is, the etching is so carried out that the lowermost metal layer 322 is left.

The manufacturing method for a semiconductor wafer according to an embodiment described in Patent Document 3 includes formation of a mask 340 on the lowermost metal layer 322 around the bump 330 as shown in FIG. 17E. As shown in FIG. 17E, the mask 340 is formed to overlap with a peripheral part 319 of the opening 318 in the passivation layer 316. Furthermore, the mask 340 is formed in close contact with the side surface of the bump 330 as shown in FIG. 17E. The material for forming the mask 340 is not particularly limited. The mask 340 may be formed by providing a mask material on the lowermost metal layer 322 and then carrying out exposure and development for example. This mask material may be any of positive materials and negative materials.

The manufacturing method for a semiconductor wafer according to an embodiment described in Patent Document 3 includes removal of the part of the lowermost metal layer 322 exposed outside the mask 340 in a second etching step as shown in FIG. 17F. A metal layer 321 may be formed by etching the lowermost metal layer 322 (see FIG. 17G).

The manufacturing method for a semiconductor wafer according to an embodiment described in Patent Document 3 may include removal of the mask 340 as shown in FIG. 17G.

In the manufacturing method for a semiconductor wafer according to an embodiment described in Patent Document 3, as described above, the lowermost metal layer 322 is etched after the step of removing the part of the metal layer other than the lowermost metal layer 322, outside the bump 330. Therefore, it is possible to prevent the lowermost metal layer 322 from being side-etched to a larger extent compared with the upper metal layer, and thus separation between the metal layers can be avoided. Furthermore, the step of etching the lowermost metal layer 322 is carried out with use of the mask 340 formed around the bump 330. Therefore, the size of the metal layer 321 is larger than those of other metal layers and the bump 330. This can offer a reduced tendency of separation of the bump 330 from the metal layer 321. In addition, the mask 340 is formed so as to be in close contact with the side surface of the bump 330 and overlap with the peripheral part 319 of the opening 318 in the passivation layer 316. Therefore, the metal layer 321 can be formed to cover an exposed part 315 of the pad 314. That is, exposure of the pad 314 can be prevented. Thus, a semiconductor wafer having high reliability can be manufactured.

FIGS. 18A to 18E are diagrams for explaining steps for forming a bump electrode and the occurrence of side etching in a related art.

As shown in a plan view and a sectional view along the line W-W of FIG. 18A, a pad electrode (Al pad electrode) 14 is formed on an insulating layer ($SiO_2$) 12 deposited on a Si substrate 10, and then a passivation layer formed of a silicon oxide ($SiO_2$) film 16b and a silicon nitride ($Si_3N_4$) film 18 is formed on the entire surface, followed by formation of an opening 15a in the passivation layer by etching.

Subsequently, as shown in a sectional view along the line W-W of FIG. 18B, an underlying metal layer (seed layer) 22 is formed on the entire surface by sputtering or the like. The underlying metal layer 22 includes a part to be removed by etching in a later step. Therefore, the underlying metal layer 22 is indicated as the black area in order to allow clear understanding of the before-etching and after-etching states thereof.

After the formation of the underlying metal layer 22, as shown in a sectional view along the line W-W of FIG. 18C, a resist (photoresist) 24 is applied on the entire surface, and then a bump electrode formation pattern is exposed and developed, so that an opening for forming a bump electrode 28 (having the bump electrode diameter 28a indicated by the arrowheads) is formed. Subsequently, a barrier metal layer 26 is formed by electrolytic plating on the underlying metal layer 22 exposed inside the formed opening. Furthermore, the bump electrode 28 is formed on the barrier metal layer 26 by solder plating.

Subsequently, as shown in a sectional view along the line W-W and a partially enlarged sectional view thereof in FIG. 18D, the resist 24 is removed, and then the underlying metal layer 22 other than the layer 22 under the bump electrode 28 is removed by wet etching with use of the bump electrode 28 as the mask. At the time of the wet etching, the underlying metal layer 22 under the barrier metal layer 26 is also etched (side-etched) simultaneously, which generates a side-etched part 36 resulting from removal of the underlying metal layer 22 under the barrier metal layer 26.

After the wet etching, as shown in a sectional view along the line W-W of FIG. 18E, solder flux is applied on the bump electrode 28, and then heat treatment in a reflow furnace is carried out to homogenize the composition and shape of the bump electrode, followed by clean-removal of the flux. This is the end of the forming steps for the bump electrode 28.

As described in the explanation based on FIG. 18 for the forming steps for the bump electrode in a related art, if the bump electrode is formed by using electrolytic plating, at the time of removal of the underlying metal layer by wet etching, the underlying metal layer under the barrier metal layer is also etched (side-etched) simultaneously, and hence the area of the underlying metal layer becomes smaller than that of the barrier metal layer. That is, an undercut is developed in the underlying metal layer under the barrier metal layer. This decreases the bonding area between the barrier metal layer and the underlying metal layer, which lowers the bonding strength between the bump electrode and the semiconductor substrate. This problem becomes more serious as the pitch and diameter of the bump electrodes become smaller along with increase in the integration degree of LSIs. In addition, depending on the case, the bump electrodes will be separated at the time of the removal of the underlying metal layer by wet etching. Therefore, an undercut due to side etching is a big problem: it causes the lowering of the yield and reliability.

In order to prevent the side etching, as disclosed in e.g. Patent Documents 2 and 3, the following schemes are employed: a scheme in which a protective layer for preventing progression of side etching of an underlying metal layer is provided around a bump electrode; and a scheme in which a mask is provided around a bump electrode. However, these schemes need addition of steps of forming the protective layer, removing the protective layer, forming the mask, and removing the mask. Therefore, these schemes problematically cause increases in the manufacturing costs and TAT.

SUMMARY OF THE INVENTION

There is a need for the present invention to prevent the lowering of the bonding strength between an external connection electrode and a substrate attributed to decrease in the bonding area between a barrier metal layer and an underlying metal layer, arising due to side etching at the time of removal of the unnecessary part of the underlying metal layer by wet etching, to thereby provide an electronic component having an external connection electrode that allows highly reliable electric connection. There is another need for the invention to provide a semiconductor device employing this electronic component, and a method for manufacturing an electronic component.

According to one embodiment of the present invention, there is provided an electronic component including a passivation layer in which an opening that exposes a part of a pad electrode is formed, an underlying metal layer formed on the pad electrode and the passivation layer, and a barrier metal layer formed on the underlying metal layer for an external connection electrode. The electronic component further includes a recess or/and a projection configured to be provided under the barrier metal layer outside or/and inside the opening. The underlying metal layer is formed on the recess or/and the projection and has a surface shape that follows the recess or/and the projection.

According to another embodiment of the present invention, there is provided a semiconductor device to which the above-described electronic component is externally connected via the external connection electrode.

According to another embodiment of the present invention, there is provided a method for manufacturing an electronic component, including the step of forming a passivation layer having an opening that exposes a part of a pad electrode, the step of forming an underlying metal layer on the pad electrode and the passivation layer, and the step of forming a barrier metal layer on the underlying metal layer for an external connection electrode. The method further includes the steps of forming a recess or/and a projection under the barrier metal layer outside or/and inside the opening, and forming the underlying metal layer on the recess or/and the projection so that the underlying metal layer may have a surface shape that follows the recess or/and the projection.

In the electronic component according to the embodiment of the present invention, the underlying metal layer is formed on the recess or/and the projection provided under the barrier metal layer outside or/and inside the opening, so that the underlying metal layer has a surface shape that follows the recess or/and the projection. Thus, the area of the underlying metal layer formed under the external connection electrode can be increased. This can prevent the lowering of the bonding strength between the external connection electrode and the substrate attributed to decrease in the bonding area between the barrier metal layer and the underlying metal layer, arising due to side etching (undercut) at the time of removal of the unnecessary part of the underlying metal layer by wet etching. Consequently, an electronic component having an external connection electrode that allows highly reliable electric connection can be provided.

Furthermore, the semiconductor device employing the electronic component according to the embodiment of the present invention is externally connected to the electronic component via the external connection electrode. This can provide a semiconductor device that allows highly reliable electric connection between the electronic component and the substrate on which the electronic component is mounted.

In addition, the method for manufacturing an electronic component according to the embodiment of the present invention includes the step of forming the underlying metal layer on the recess or/and the projection provided under the barrier metal layer outside or/and inside the opening so that the underlying metal layer may have a surface shape that follows the recess or/and the projection. Thus, the area of the underlying metal layer formed under the external connection electrode can be increased. This can prevent the lowering of the bonding strength between the external connection electrode and the substrate attributed to decrease in the bonding area between the barrier metal layer and the underlying metal layer, arising due to side etching at the time of removal of the unnecessary part of the underlying metal layer by wet etching. Consequently, a method for manufacturing an electronic component having an external connection electrode that allows highly reliable electric connection can be provided.

BRIEF DESCRIPTION OF THE DRAWINGS

FIG. 1 is a sectional view and a partially enlarged sectional view for explaining bump electrode formation according to a first embodiment of the present invention, in which a barrier surrounding a pad electrode is formed to thereby suppress the influence of side etching;

FIG. 2 is a flowchart for explaining the procedure of the bump electrode formation according to the first embodiment;

FIGS. 10A to 10E are diagrams for explaining the procedure of the bump electrode formation according to the third embodiment;

FIGS. 11A to 11D are plan views and sectional views along the line Y-Y for explaining examples of the barrier on a passivation layer according to the third embodiment;

DETAILED DESCRIPTION OF THE PREFERRED EMBODIMENTS

Figure 3A:
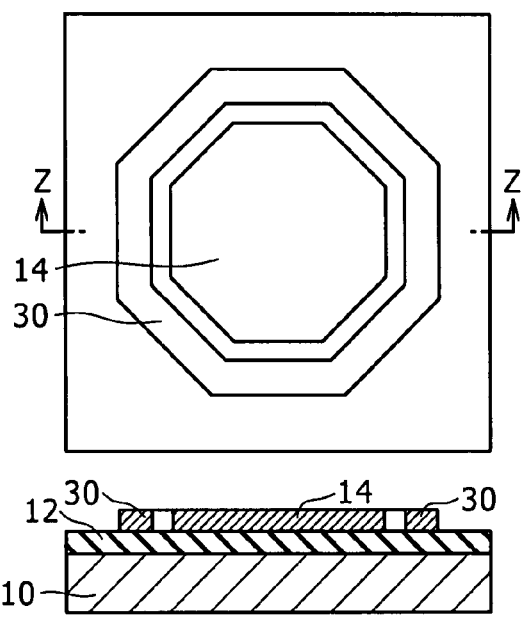
FIGS. 3A to 3F are diagrams for explaining the procedure of the bump electrode formation according to the first embodiment.

In the electronic component according to the embodiment of the present invention, it is preferable that the recess or/and the projection be formed across the whole of outer periphery or/and inner periphery of the opening. This can increase the area of the underlying metal layer formed under the external connection electrode, and thus can suppress the influence of the side etching caused at the time of removal of the unnecessary part of the underlying metal layer by wet etching.

Furthermore, it is preferable that the recess or/and the projection be formed of a pattern provided at outer periphery of the pad electrode. This can increase the area of the underlying metal layer under the external connection electrode without the need for complicated steps.

In addition, it is preferable that the recess be formed of the gap between the pad electrode and a conductive pattern formed at outer periphery of the pad electrode, and have a ring shape. This allows the pad electrode and the conductive pattern to be formed in the same step simultaneously.

Moreover, it is preferable that the projection be formed on the passivation layer on inner periphery of the pad electrode, and have a ring shape. According to this configuration, the projection is formed on the passivation layer outside the opening, and thus the underlying metal layer is formed on the surface of the projection. Furthermore, inside the opening, the bonding between the underlying metal layer and the barrier metal layer is kept. Therefore, the formation area of the underlying metal layer can be increased, and hence the bonding strength between the external connection electrode and the electronic component is not lowered.

Furthermore, it is preferable that the recess be formed in the passivation layer on inner periphery of the pad electrode, and have a ring shape. This allows the recess and the projection to be formed in the same step, simultaneously with formation of the opening that exposes a part of the pad electrode, through etch-removal of the passivation layer.

In addition, it is preferable that at least one layer in the passivation layer be formed by a high density plasma (HDP-CVD) method on a region that includes a recess thereon. According to this configuration, the high density plasma method allows the passivation layer to be formed to cover the shape of the recess, and thus the formation area of the underlying metal layer can be increased.

Embodiments of the present invention will be described in detail below with reference to the accompanying drawings. In the following description of the embodiments, a bump electrode formed over a substrate is employed as an example of the external connection electrode. In the respective drawings, only factors relating to bump electrode formation will be shown about one bump electrode formation region centered at a pad electrode over which a bump electrode is to be formed.

Examples of a substrate over which an external connection electrode is formed include semiconductor substrates such as silicon chips and mounting substrates formed of various electrically insulating materials. If the external connection electrode is an electrode (ACF connection electrode) for connection to a pad electrode formed over a substrate by use of ACF (anisotropic conductive film material), a bump electrode is not formed over this substrate. In this case, in the respective embodiments to be described below, a bump electrode is replaced by an ACF connection electrode.

First Embodiment

In a first embodiment of the present invention, a ring barrier 30 surrounding a pad electrode 14 is formed, and a bump electrode (protruding electrode) is formed above the pad electrode and the barrier. The barrier is to increase the length and area of the continuous part of an underlying metal layer and to suppress the influence of the occurrence of side etching, similarly to the respective subsequent embodiments. The form of the barrier formation differs among the following respective embodiments, and will be explained in detail in the descriptions of the embodiments.

In the present embodiment, the diameter of a pad electrode over which a bump electrode is to be formed is set smaller than that of the bump electrode. Furthermore, e.g. a metal pattern is disposed as a ring barrier in such a manner as to surround the pad electrode (in a ring manner for example). The ring barrier provided along the outline of the pad electrode is formed on the same plane as that on which the pad electrode is formed. In addition, the ring recess formed between the pad electrode and the ring barrier is positioned inside the projection of the bump electrode (projection to the plane on which the pad electrode is formed).

Because the ring recess is formed between the pad electrode and the ring barrier, when a passivation layer including at least one HDP (High Density Plasma)-SiO$_2$ layer is formed on the pad electrode and the metal pattern, a step formed of a recess is formed in the passivation layer outside an opening formed in the passivation layer (opening for forming the bump electrode) at the outer periphery of the pad electrode. That is, this recess is formed in a ring form in such a manner as to surround the opening.

The formation of the passivation layer is followed by formation of the opening for forming the bump electrode, an underlying metal layer, a barrier metal layer, and the bump electrode. As a result, the underlying metal layer having a step formed of a recess is formed under the barrier metal layer and outside the bump electrode formation opening. This can offer an increased surface area of the underlying metal layer under the barrier metal layer. Thus, even when side etching is caused, a large bonding area between the underlying metal layer and the barrier metal layer can be ensured, which can suppress the influence of the side etching.

FIG. 1 is a sectional view along the line Z-Z (see FIG. 3) and a partially enlarged sectional view for explaining formation of a bump electrode 28 in the first embodiment, in which the influence of side etching of an underlying metal layer 22 is suppressed by forming the barrier 30 surrounding the pad electrode 14.

FIG. 2 is a flowchart for explaining the procedure of the formation of the bump electrode 28 in the present embodiment, including the formation of the barrier 30 surrounding the pad electrode 14.

Figure 3C:
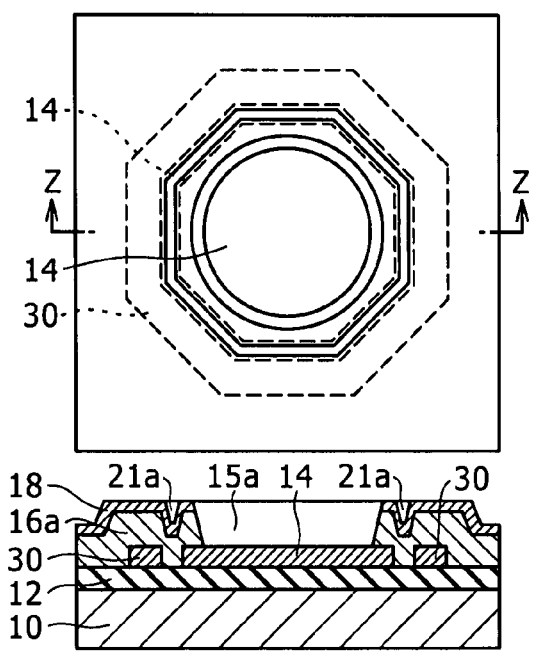
Figure 3B:
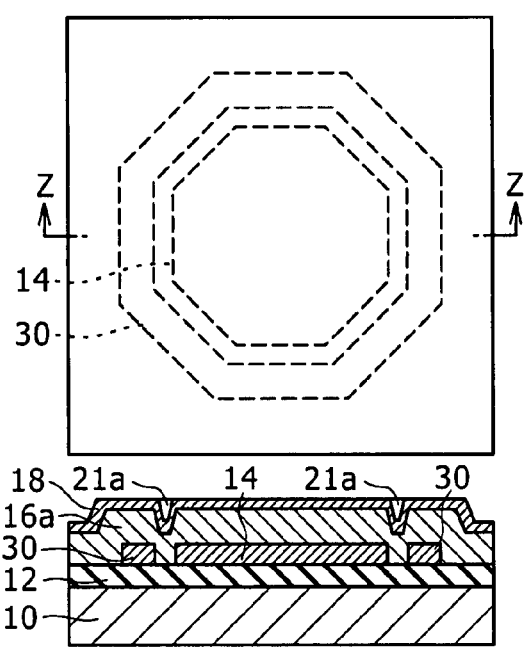
Figure 3E:
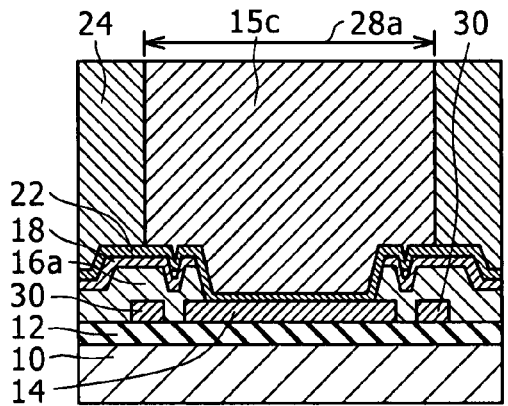
Figure 3D:
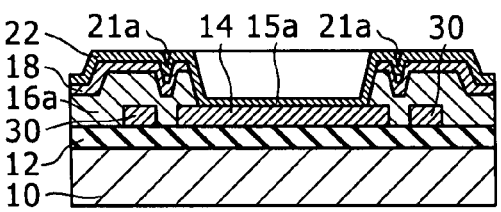
Figure 3F:
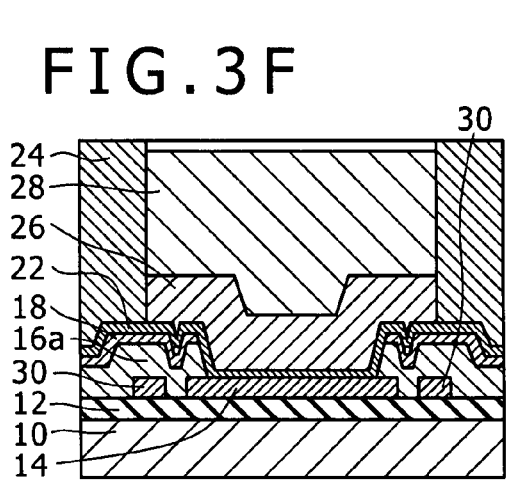
Figure 4A:
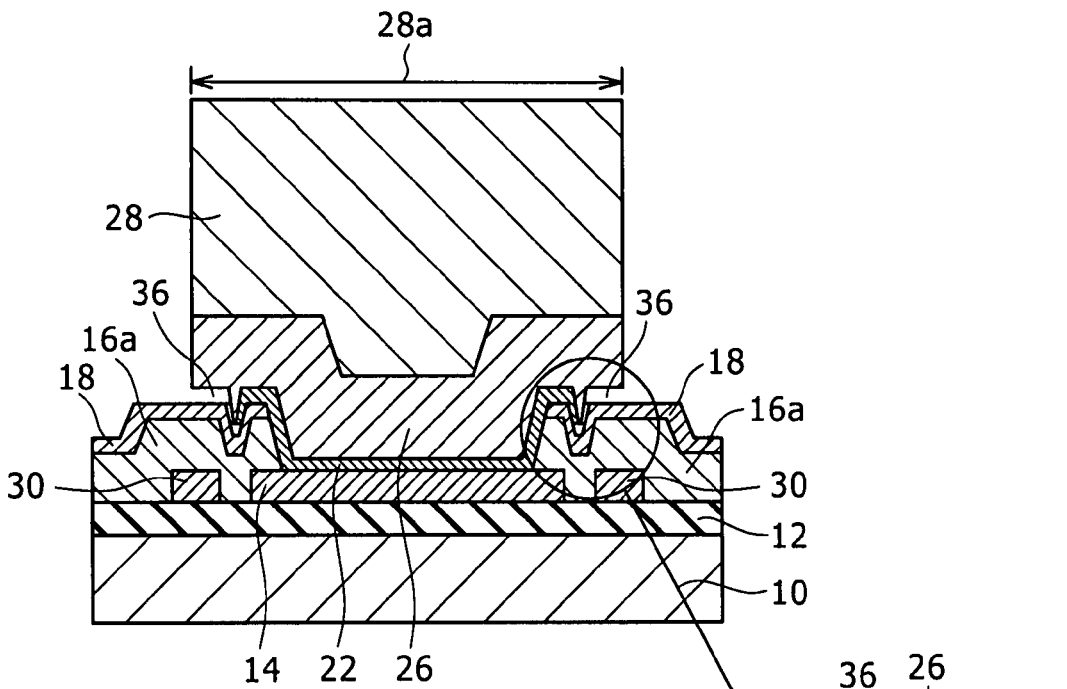
FIGS. 4A and 4B are diagrams for explaining the procedure of the bump electrode formation according to the first embodiment.
Figure 4B:
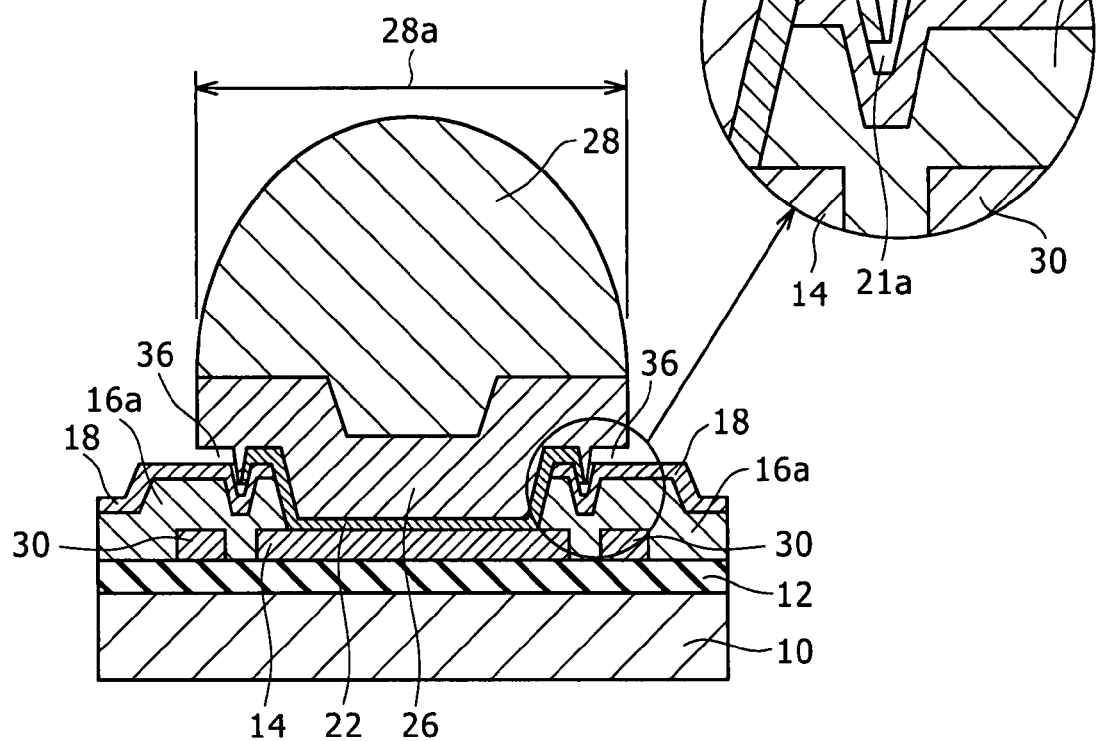

FIGS. 3 and 4 are diagrams for explaining the procedure of the formation of the bump electrode 28 in the present embodiment including the formation of the barrier 30 surrounding the pad electrode 14. FIGS. 3A to 3F are plan views and sectional views along the line Z-Z. FIGS. 4A and 4B are sectional views along the line Z-Z.

As shown in the sectional view along the line Z-Z and the partially enlarged sectional view of FIG. 1, the underlying metal layer 22 other than the layer 22 in the region under a barrier metal layer 26 is removed by wet etching. Due to this wet etching, the underlying metal layer 22 under the barrier metal layer 26 is also etched (side-etched) simultaneously. This generates a side-etched part 36 resulting from the removal of the underlying metal layer 22 under the barrier metal layer 26.

In the present embodiment, the underlying metal layer 22 is formed also inside a recess 21a of a passivation layer 20. Due to the existence of the recess 21a, the area (when viewed in a plan view) and the length (when viewed in a sectional view) of the underlying metal layer 22 existing under the barrier metal layer 26 are larger than those in the related art shown in FIG. 18.

Therefore, as shown in FIG. 1, although the side-etched part 36 is generated, the area and length of the underlying metal layer 22 that remains under the barrier metal layer 26 without being side-etched are larger than those in the related arts shown in FIGS. 15 to 18. Consequently, the bonding area between the barrier metal layer 26 and the underlying metal layer 22 is larger than that in the related arts, which can offer enhanced reliability and prevent the lowering of the bonding strength between the bump electrode 28 and a semiconductor substrate 10.

In the present embodiment, initially, on an insulating layer (e.g., $SiO_2$) 12 formed on a semiconductor substrate (e.g., a Si substrate including Tr and so on (not shown) or Si-interposer) 10, the pad electrode (Al pad electrode) 14 and the barrier ring 30 serving as an outer peripheral layer (composed of Al and formed in a ring shape for example) formed to surround the pad electrode 14 are formed (see a plan view and a sectional view along the line Z-Z of FIG. 3A). As described later, the barrier ring 30 is to increase the length and area of the continuous part of the underlying metal layer and to suppress the influence of the occurrence of side etching. In the present embodiment, the barrier ring 30 is formed of the same material (Al) as that of the pad electrode, and the thickness thereof is made identical to that of the pad electrode 14. The barrier ring 30 may be formed of another conductive material or an insulating material.

Subsequently to the formation of the pad electrode 14 and the barrier ring 30, an HDP (High Density Plasma)-silicon oxide ($SiO_2$) film 16a deposited by HDP is formed on the entire surface. Furthermore, a silicon nitride ($Si_3N_4$) film 18 is formed thereon (see a plan view and a sectional view along the line Z-Z of FIG. 3B). The passivation layer (surface protective layer) 20 is formed of the HDP-silicon oxide ($SiO_2$) film 16a and the silicon nitride film 18.

In the HDP deposition, film deposition proceeds in such a way that a film deposited to overlap over a trench is removed with use of plasma-activated ions. Therefore, the HDP deposition can provide enhanced step coverage and improved burying property. Consequently, the passivation layer 20 is deposited also inside the ring recess formed of the gap between the pad electrode 14 and the barrier ring 30. Thus, in the top face of the passivation layer 20, the recess 21a is formed to cover the under recess shape. In contrast, CVD employing plasma of which density is lower than that of the HDP (e.g., TEOS (Tetra Ethyl Ortho Silicate)/$O_2$-CVD or $SiH_4/N_2O$-CVD) is unsuitable for formation of a film inside a narrow and deep trench because the step coverage by this CVD is worse.

After the formation of the passivation layer 20, an opening is formed in the passivation layer 20 by etching, so that a part of the pad electrode 14 is exposed, as described later in detail. Subsequently, the underlying metal layer (seed layer) 22 is formed on the entire surface by sputtering or the like. The underlying metal layer 22 includes a part to be removed by etching in a later step. Therefore, the underlying metal layer 22 is indicated as the black area in order to allow clear understanding of the before-etching and after-etching states thereof (same also in the following respective drawings).

After the formation of the underlying metal layer 22, as described later in detail, a resist (photoresist) is applied on the entire surface, and then a bump electrode formation pattern is exposed and developed, so that an opening for forming the bump electrode 28 (having the bump electrode diameter 28a indicated by the arrowheads) is formed. Subsequently, the barrier metal layer 26 is formed by electrolytic plating on the underlying metal layer 22 exposed inside the formed opening. Furthermore, the bump electrode 28 is formed on the barrier metal layer 26 by electrolytic plating.

With reference to FIGS. 1, 3 and 4, a description will be made below about the respective steps shown in FIG. 2, for forming the bump electrode 28 after the formation of the barrier 30 surrounding the pad electrode 14.

S1a: Formation of a Barrier Surrounding a Pad Electrode

As described with FIG. 3A, the pad electrode 14 and the outer peripheral layer (formed of the barrier ring 30) surrounding the pad electrode 14 are formed on the insulating layer 12 deposited on the semiconductor substrate 10. The diameter of the pad electrode 14 is smaller than that of the bump electrode 28. The barrier ring 30 may be formed of the same material and have the same thickness as those of the pad electrode 14. Alternatively, the barrier ring 30 may be formed of an insulating material.

In the example shown in FIG. 3A, the pad electrode 14 has a regular octagonal shape, and the barrier ring 30 has an octagonal ring shape: the barrier ring 30 includes a regular octagonal hollow part and the outline thereof has a regular octagonal shape.

S1b: Formation of a Passivation Layer

As shown in FIG. 3B, the HDP-silicon oxide film 16a is formed on the entire surface by HDP. Furthermore, the silicon nitride film 18 is formed thereon. The passivation layer (surface protective layer) 20 is formed of the HDP-silicon oxide ($SiO_2$) film 16a and the silicon nitride film 18.

Due to the HDP, which can offer enhanced step coverage and improved burying property, the passivation layer 20 is formed to cover the shape of the recess formed of the gap between the pad electrode 14 and the barrier ring 30. As a result, in the top face of the passivation layer 20, the recess 21a of the passivation layer is formed and hence a step is generated.

S1c: Formation of Opening in the Passivation Layer

As shown in a plan view and a sectional view along the line Z-Z of FIG. 3C, an opening 15a is formed in the passivation layer by etching. As a result, a part of the pad electrode 14 is exposed (the diameter of the opening 15a is smaller than that of the pad electrode 14).

S2: Formation of an Underlying Metal Layer

As shown in a plan view and a sectional view along the line Z-Z of FIG. 3D, the underlying metal layer 22 (indicated as the black area) is formed on the entire surface by sputtering or the like. Because the underlying metal layer 22 is formed also inside the recess 21a of the passivation layer 20, the recess 21a is formed and hence a step is generated also in the underlying metal layer 22. The underlying metal layer 22 shows good adhesion to the passivation layer 20. The underlying metal layer 22 is formed as a seed layer (underlayer) for an upper metal plated layer and is used as an electrode in formation of the metal plated layer. The unnecessary part of the underlying metal layer 22 is to be removed by wet etching in a later step.

S3: Application of a Resist
A photoresist 24 is applied on the entire surface.
S4: Exposure of a Bump Electrode Pattern
A pattern for forming the bump electrode is subjected to exposure.
S5: Development (Formation of a Bump Electrode Formation Opening)
As shown in a sectional view along the line Z-Z of FIG. 3E, development is carried out so that an opening 15c for forming the bump electrode (having the bump electrode diameter 28a indicated by the arrowheads) 28 may be formed in the photoresist 24.
S6: Formation of a Barrier Metal Layer
As shown in a sectional view along the line Z-Z of FIG. 3F, the barrier metal layer 26 is formed by electrolytic plating on the underlying metal layer 22 exposed inside the opening 15c. The barrier metal layer 26 is used to prevent diffusion and inter-reaction of metal materials and is composed of a material showing good adhesion to the adjacent materials.
S7: Solder Plating
As shown in FIG. 3F, the bump electrode 28 is formed on the barrier metal layer 26 by electrolytic plating.
S8: Removal of the Resist
As shown in a sectional view along the line Z-Z of FIG. 4A, the photoresist 24 is removed.
S9: Etching of the Underlying Metal Layer
As shown in FIG. 4A and a partially enlarged sectional view thereof, with use of the barrier metal layer 26 as a mask, the underlying metal layer 22 other than the layer 22 under the barrier metal layer 26, i.e., the layer 22 outside the barrier metal layer 26, is removed by wet etching. By this wet etching, the underlying metal layer 22 under the barrier metal layer 26 is also etched simultaneously. As a result, the underlying metal layer 22 under the barrier metal layer 26 is partially removed, which generates the side-etched part 36.
S10: Application of Flux
As shown in a sectional view along the line Z-Z of FIG. 4B, solder flux is applied on the bump electrode 28.
S11: Heat Treatment in a Reflow Furnace
As shown in FIG. 4B, heat treatment in a reflow furnace is carried out to homogenize the composition and shape of the bump electrode 28.
S12: Clean-Removal of the Flux
As shown in FIG. 4B, the flux is clean-removed, so that the forming steps for the bump electrode 28 are completed.

In the above-described procedure of the bump electrode formation according to the present embodiment, the side-etched part 36 is generated. However, the underlying metal layer 22 having the recess 21a and hence a step is formed under the barrier metal layer 26. Thus, the area (when viewed in a plan view) and the length (when viewed in a sectional view) of the underlying metal layer 22 formed under the barrier metal layer 26 are larger than those in the related art shown in FIG. 18 (see the partially enlarged sectional views of FIGS. 1, 4A and 4B). As a result, in the present embodiment, although the side-etched part 36 is generated at the time of the removal of the unnecessary part of the underlying metal layer 22 by wet etching, the area of the underlying metal layer 22 that remains under the barrier metal layer 26 without being side-etched is larger than that in the related arts shown in FIGS. 15 to 18. Therefore, a larger bonding area between the barrier metal layer 26 and the underlying metal layer 22 can be ensured compared with the related arts, which can keep a higher bonding strength and offer enhanced reliability.

An example of the sizes of the respective elements in the above-described embodiment is as follows.

The pad electrode 14 is an Al layer that has a thickness of 1 μm and has a regular octagonal shape circumscribing a circle having a diameter of 22 μm. The barrier ring 30 is an Al layer that has a thickness of 1 μm and has an octagonal ring shape formed of a regular octagon circumscribing a first circle having a diameter of 26 μm and a regular octagon circumscribing a second circle having a diameter of 34 μm. Accordingly, the length of the gap between the pad electrode 14 and the barrier ring 30 is 2 μm. The total thickness of the HDP-silicon oxide film 16a and the silicon nitride film 18 formed over the pad electrode 14, i.e., the thickness of the passivation layer 20, is 1 μm. The thickness of the underlying metal layer 22 is 0.2 μm.

The diameter of the top part of the opening 15a is 18 μm. The diameter of the top part of the opening 15c is 30 μm, and therefore the bump electrode diameter 28a is 30 μm. The thickness of the barrier metal layer 26 is 5 μm.

FIGS. 5A to 5F are plan views for explaining examples of the barrier ring 30 surrounding the pad electrode 14 according to the present embodiment.

Figure 5A:
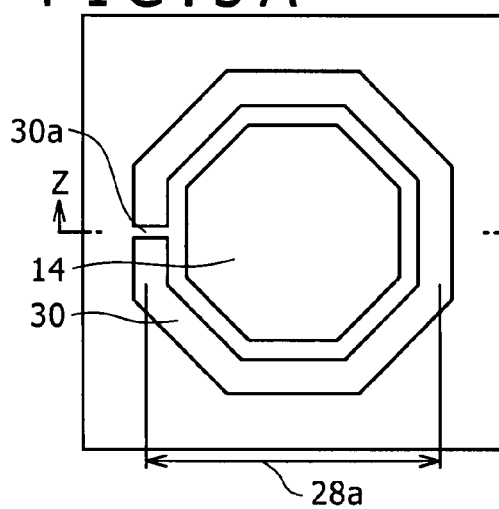
FIGS. 5A to 5F are plan views for explaining examples of the barrier surrounding a pad electrode according to the first embodiment.

As shown in FIG. 5A, in the barrier ring 30 that has an octagonal ring shape and serves as an outer peripheral layer surrounding the regular octagonal pad electrode 14 shown in FIG. 3A, an absent part 30a that offers a discontinuous part with respect to the circumferential direction of the barrier ring 30 may be provided at one place.

Figure 5B:
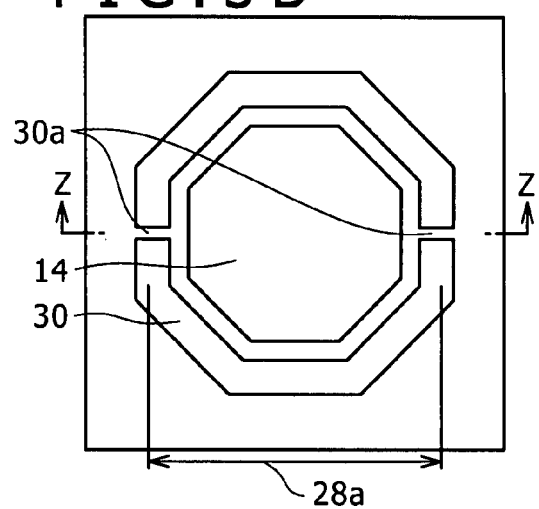

As shown in FIG. 5B, the absent parts 30a shown in FIG. 5A may be provided at two places. The number of the absent parts 30a may be set to any number optionally.

Figure 5C:
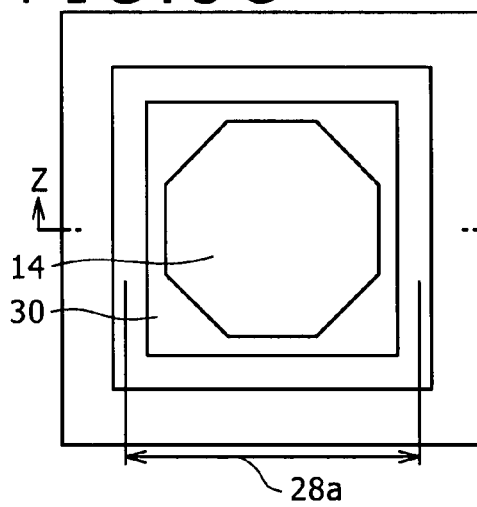

As shown in FIG. 5C, the barrier ring 30 that serves as an outer peripheral layer surrounding the regular octagonal pad electrode 14 may have a square ring shape formed of squares circumscribing first and second circles, respectively.

Figure 5D:
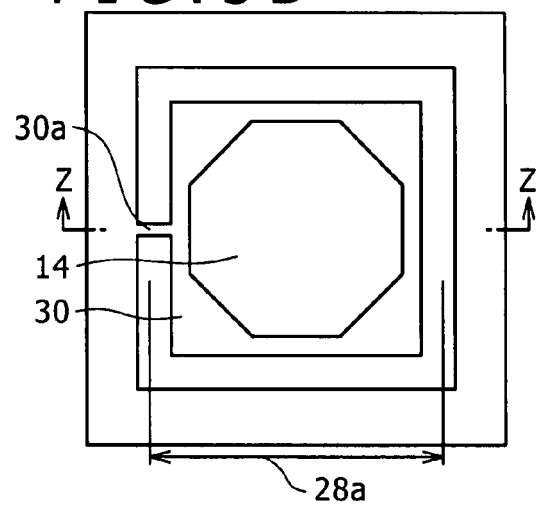

As shown in FIG. 5D, the absent part 30a may be provided in the square ring barrier 30 shown in FIG. 5C.

Figure 5E:
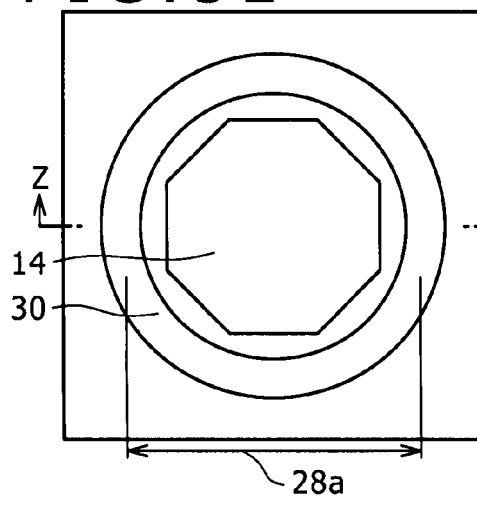
Figure 5F:
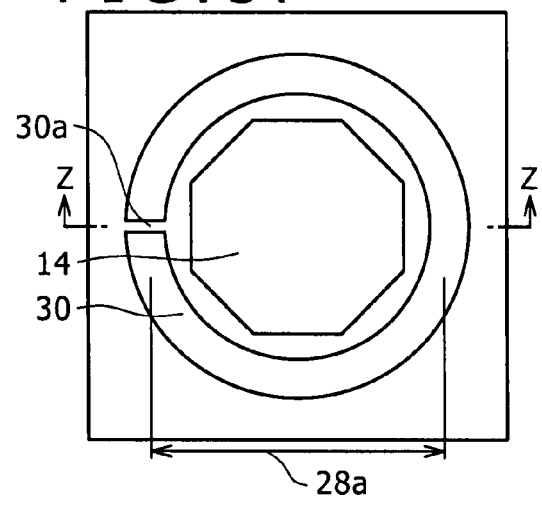

As shown in FIGS. 5E and 5F, the square ring barriers 30 in FIGS. 5C and 5D may be replaced by the barrier rings 30 having a circular ring shape formed of two circles having different diameters.

The absent part 30a, which offers a discontinuous part with respect to the circumferential direction of the barrier ring 30 serving as an outer peripheral layer surrounding the pad electrode 14, is formed at any single or plural positions along the circumferential direction of the barrier ring 30. The absent part 30a is used to allow passage of an interconnect line electrically connected to the pad electrode 14.

The shapes of the pad electrode 14 and the barrier ring 30 (ring shape pattern) formed in the periphery surrounding the pad electrode 14 may be any of a circular shape, rectangular shape, and polygonal shape. However, it is effective to employ a circular or polygonal shape in terms of achievement of a large contact area between the barrier metal layer 26 and the underlying metal layer 22.

Second Embodiment

In a second embodiment of the present invention, projection and recess ring barriers are formed by using a passivation layer 20 on the inner periphery of a pad electrode 14, and a bump electrode 28 is formed above the pad electrode and the barriers. Specifically, these projection and recess ring barriers are formed on the pad electrode along the circumferential direction of an opening, and are formed at positions inside the projection of the bump electrode (projection to the plane on which the pad electrode is formed).

In the present embodiment, in a passivation layer on the pad electrode over which the bump electrode is to be formed, a center first opening (e.g., a circular opening, this opening is equivalent to the opening in the first embodiment) and a second opening (e.g., a circular ring opening) for forming a barrier surrounding the first opening are simultaneously formed (the diameter of the first opening and the outer diameter of the second opening are smaller than the diameter of the pad electrode).

That is, a recess and a projection are formed in the passivation layer on the inner periphery of the pad electrode. Thus, the second opening (ring recess) and a ring projection are formed at the outer periphery of the first opening. As a result, the recess and the projection formed of the passivation layer are provided on the pad electrode, and steps are formed due to the recess and the projection.

For example, the passivation layer is left in a ring shape on the pad electrode and thereby the projection is formed, so that the recess is formed between this projection and the passivation layer (existing around the outer periphery of the pad electrode). As a result, steps formed of the recess and the projection are formed in the passivation layer.

The formation of the recess and the projection is followed by formation of an underlying metal layer, a barrier metal layer, and the bump electrode. As a result, the underlying metal layer having steps formed of the recess and the projection are formed. This can offer an increased surface area of the underlying metal layer under the barrier metal layer. Thus, similarly to the first embodiment, even when side etching is caused, a large bonding area between the underlying metal layer and the barrier metal layer can be ensured, which can suppress the influence of the side etching.

Figure 6:
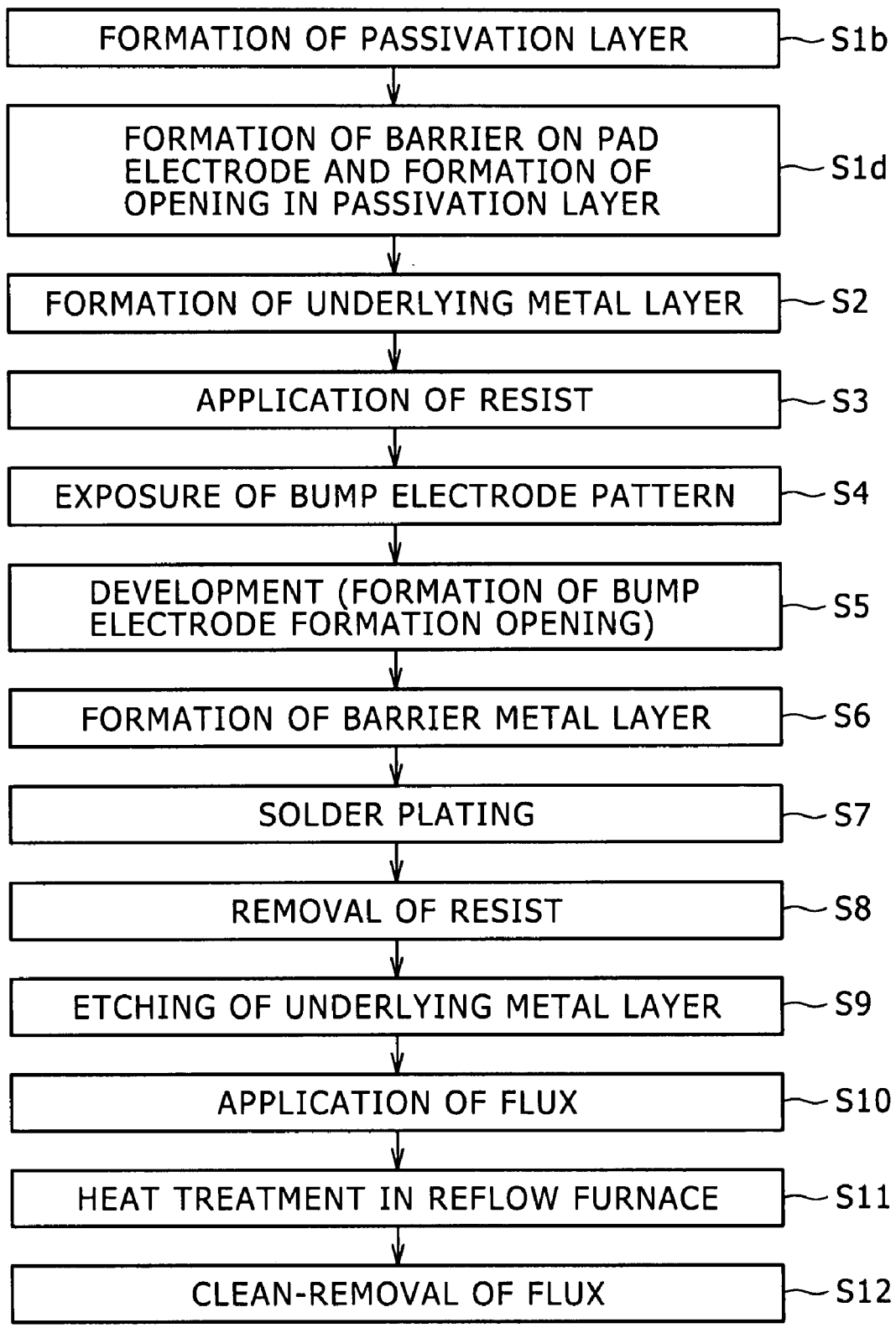
FIG. 6 is a flowchart for explaining the procedure of bump electrode formation according to a second embodiment of the invention, including formation of a barrier on a pad electrode.

FIG. 6 is a flowchart for explaining the procedure of the bump electrode formation in the second embodiment, including the formation of a barrier 32 on the pad electrode 14.

FIGS. 7A to 7E are plan views and sectional views along the line X-X for explaining the procedure of the formation of the bump electrode 28 in the present embodiment, including the formation of the barrier 32 on the pad electrode 14.

The respective steps shown in FIG. 6 will be described below with reference to FIG. 7. Note that explanation of the features in common with the first embodiment will be omitted because they have been already described above, and only different points will be explained in the following description.

S1b: Formation of a Passivation Layer

Figure 7A:
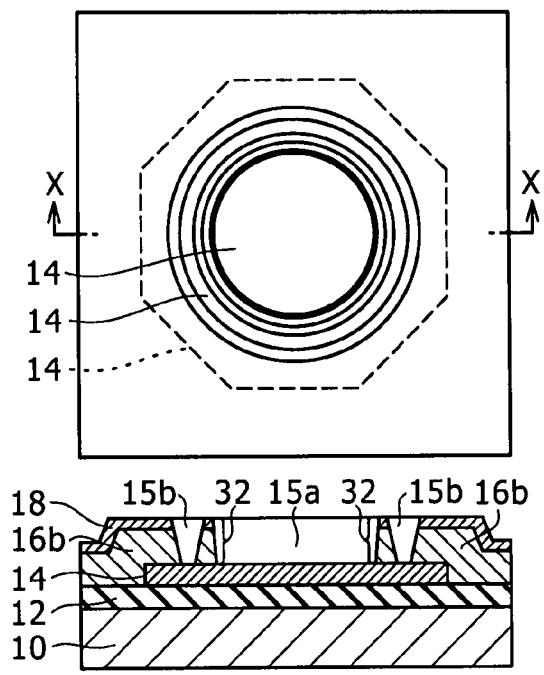
FIGS. 7A to 7E are diagrams for explaining the procedure of the bump electrode formation according to the second embodiment.

As shown in a plan view and a sectional view along the line X-X of FIG. 7A, similarly to the first embodiment, the pad electrode 14 (the shape thereof is the same as that in the first embodiment, but the diameter thereof is the same as that of the bump electrode 28) is formed on an insulating layer 12 deposited on a semiconductor substrate 10, and then a passivation layer 20 (formed of a silicon oxide film 16b and a silicon nitride film 18) is formed on the entire surface. In the present embodiment, the silicon oxide film 16b is formed of a CVD-SiO$_2$ film deposited by using plasma of which density is lower than that of HDP (e.g., TEOS/O$_2$-CVD film or SiH$_4$/N$_2$O-CVD film). Alternatively, the silicon oxide film 16b may be formed of an HDP-SiO$_2$ film similarly to the first embodiment.

S1d: Formation of a Barrier on a Pad Electrode and Formation of an Opening in the Passivation Layer As shown in FIG. 7A, in the passivation layer 20 on the pad electrode 14, a center first opening 15a (e.g., a circular opening 15a) and a second opening 15b (e.g., a circular ring opening 15b) for forming a barrier surrounding the first opening 15a are simultaneously formed. The diameter of the first opening 15a and the outer diameter of the second opening 15b are smaller than the diameter of the pad electrode 14.

Due to the formation of the first and second openings 15a and 15b, the remaining passivation layer 20 (ring passivation layer) serves as the barrier ring 32 as a projection 21b between the first and second openings 15a and 15b. The projection barrier ring 32 is to increase the length and area of the continuous part of the underlying metal layer and to suppress the influence of the occurrence of side etching.

Furthermore, a recess barrier is also formed by the second opening 15a serving as the recess. This can increase the length and area of the continuous part of the underlying metal layer. In this manner, steps are formed due to the recess and the projection formed of the passivation layer 20. For example, the passivation layer 20 is left in a ring shape on the pad electrode 14 and thereby the projection is formed, so that the recess is formed between this projection and the passivation layer (existing around the outer periphery of the pad electrode 14) 20. As a result, steps formed of the recess and the projection are formed in the passivation layer 20.

The steps subsequent to the step S1d in FIG. 6 are the same as the step S2 and the subsequent steps in FIG. 2.

Figure 7B:
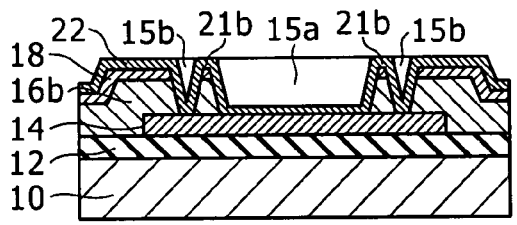

As shown in a sectional view along the line X-X of FIG. 7B, in the step S2, an underlying metal layer 22 is formed on the entire surface. As a result, the underlying metal layer 22 is formed also on the surfaces of the step parts formed of the recess 15b and the projection 21b provided in the passivation layer 20. Accordingly, the underlying metal layer 22 has steps formed due to the projection 21b and the recess 15b.

Figure 7C:
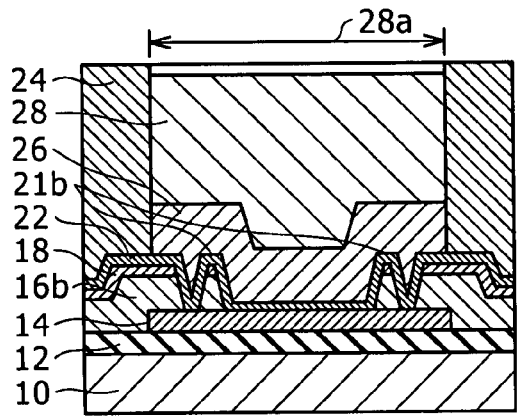
Figure 7D:
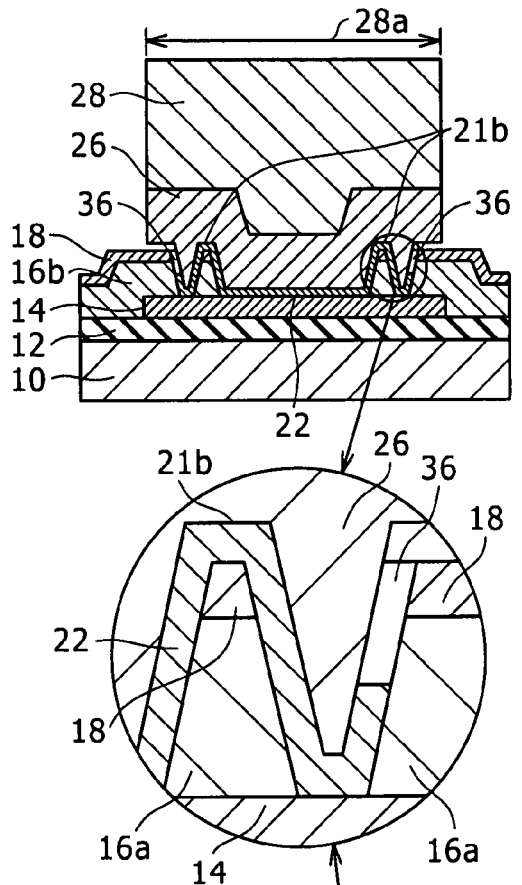
Figure 7E:
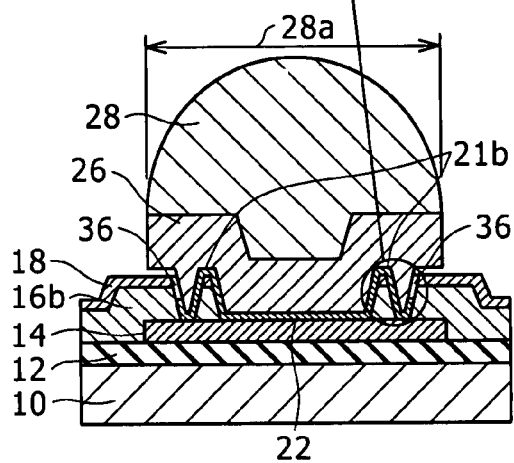

As shown in sectional views along the line X-X of FIGS. 7C, 7D, and 7E, the forming steps for the bump electrode 28 are completed through the steps S3 to S12, similarly to the first embodiment.

In the above-described procedure of the bump electrode formation in the present embodiment, a side-etched part 36 is generated similarly to the first embodiment. However, the underlying metal layer 22 that has the recess 15b and the projection 21b and hence steps is formed under a barrier metal layer 26. Thus, the area of the underlying metal layer 22 formed under the barrier metal layer 26 is larger than that in the first embodiment (see the partially enlarged sectional view of FIGS. 7D and 7E).

Consequently, in the present embodiment, although the side-etched part 36 is generated at the time of the removal of the unnecessary part of the underlying metal layer 22 by wet etching, the area of the underlying metal layer 22 that remains under the barrier metal layer 26 without being side-etched is larger than that in the first embodiment and the related arts. Therefore, a larger bonding area between the barrier metal layer 26 and the underlying metal layer 22 can be ensured compared with the first embodiment and the related arts, which can keep a higher bonding strength between the bump electrode 28 and the semiconductor substrate 10 and offer enhanced reliability.

An example of the sizes of the respective elements in the present embodiment, other than the sizes of the elements in common with the first embodiment, is as follows.

The pad electrode 14 has a thickness of 1 μm and has a regular octagonal shape circumscribing a circle having a diameter of 30 μm. The thickness of the passivation layer 20 is 1 μm. The diameter of the top part of the first opening 15a is 18 μm. The inner diameter and outer diameter of the top part of the second opening 15b are 20 μm and 24 μm, respectively.

FIGS. 8A to 8D are plan views and sectional views along the line X-X for explaining examples of the barrier 32 on the pad electrode 14 in the present embodiment.

In FIG. 8, the sectional shapes of the openings 15a and 15b are represented as rectangular shapes for simplified illustration, although these sectional shapes are not ideal rectangular shapes actually as shown in FIGS. 1, 3, 4 and 7. FIG. 8A arises from representation of FIG. 7A in this manner.

Figure 8A:
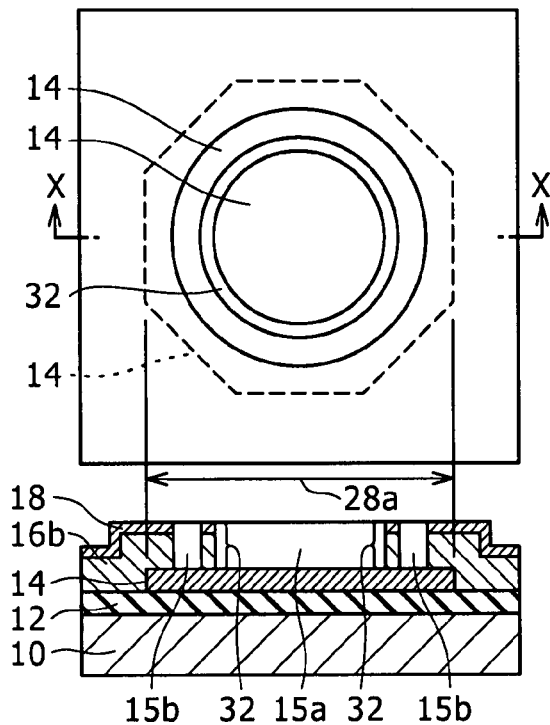
FIGS. 8A to 8D are plan views and sectional views along the line X-X for explaining examples of the barrier on a pad electrode according to the second embodiment.
Figure 8B:
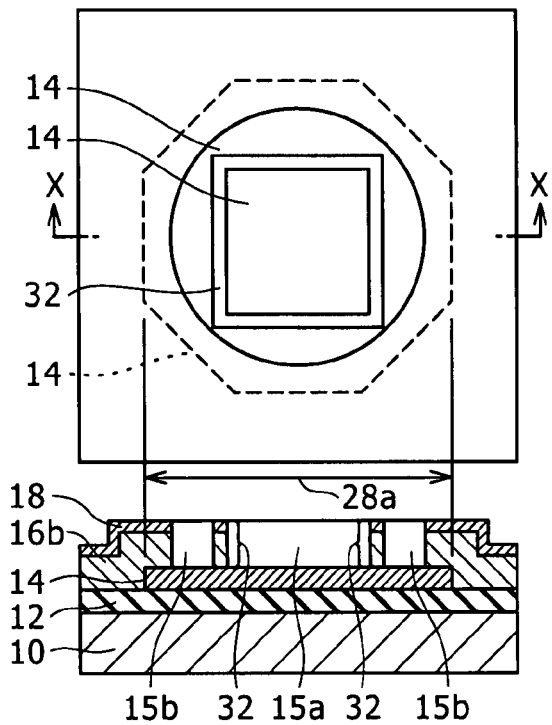
Figure 8C:
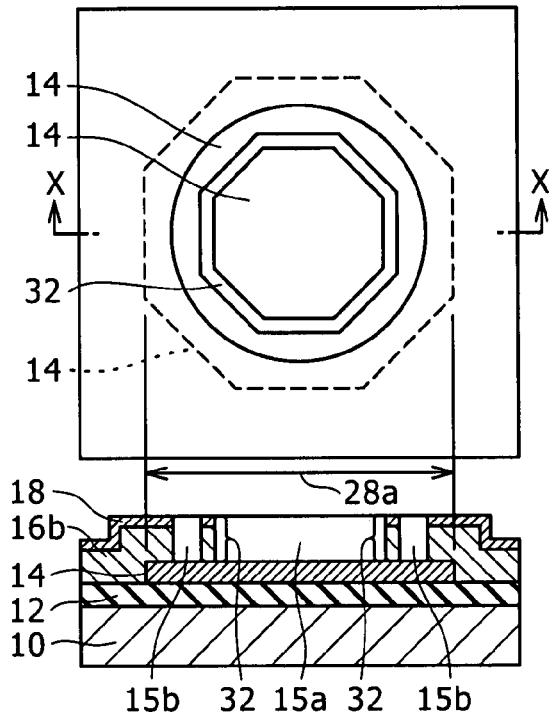

In the examples shown in FIGS. 8B and 8C, the circular barrier ring 32 shown in FIG. 8A is replaced by a square ring and a regular octagonal ring, respectively, and hence the openings 15b in these examples have a circular outer shape and a square inner shape and a regular octagonal inner shape, respectively. In the examples shown in FIGS. 8B and 8C, the width of the opening 15b varies along the circumferential direction thereof.

Figure 8D:
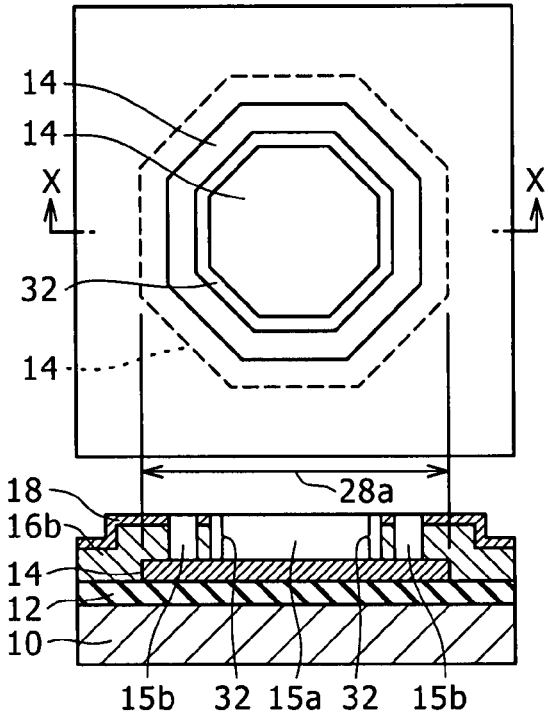

In the example shown in FIG. 8D, the opening 15b in FIG. 8C is replaced by that having a regular octagonal outer shape.

In the drawings used for the explanation of the present embodiment, the diameter of the pad electrode is the same as that of the bump electrode. However, these diameters do not need to be the same as long as the projection and recess ring barriers are formed on the pad electrode and at positions inside the projection of the bump electrode as described above. It will be obvious that the diameter of the pad electrode may be larger than that of the bump electrode.

Third Embodiment

In a third embodiment of the present invention, on a passivation layer 20 existing outside an opening 15a that exposes a part of a pad electrode 14 and on the periphery of the pad electrode 14, a ring projection barrier 34 is formed along the circumferential direction of the opening 15a. A bump electrode is formed above the pad electrode and the barrier 34. That is, the ring projection is formed at the outer periphery of the opening, and disposed on the passivation layer on the inner periphery of the pad electrode. The ring barrier 34, which is formed on the passivation layer 20 outside the opening 15a, is formed at a position inside the projection of the bump electrode (projection to the plane on which the pad electrode is formed) and between the bump electrode and the passivation layer.

In the present embodiment, an opening of which diameter is smaller than that of the bump electrode is formed in the passivation layer. On the passivation layer outside this opening, e.g. a ring projection pattern is formed as a barrier by using e.g. photosensitive resin. Subsequently, similarly to the second embodiment, an underlying metal layer, a barrier metal layer, and the bump electrode are formed. The formation of the underlying metal layer having a step formed of the projection can offer an increased surface area of the underlying metal layer under the barrier metal layer. Therefore, similarly to the first and second embodiments, even when side etching is caused, a large bonding area between the underlying metal layer and the barrier metal layer can be ensured, which can suppress the influence of the side etching.

Figure 9:
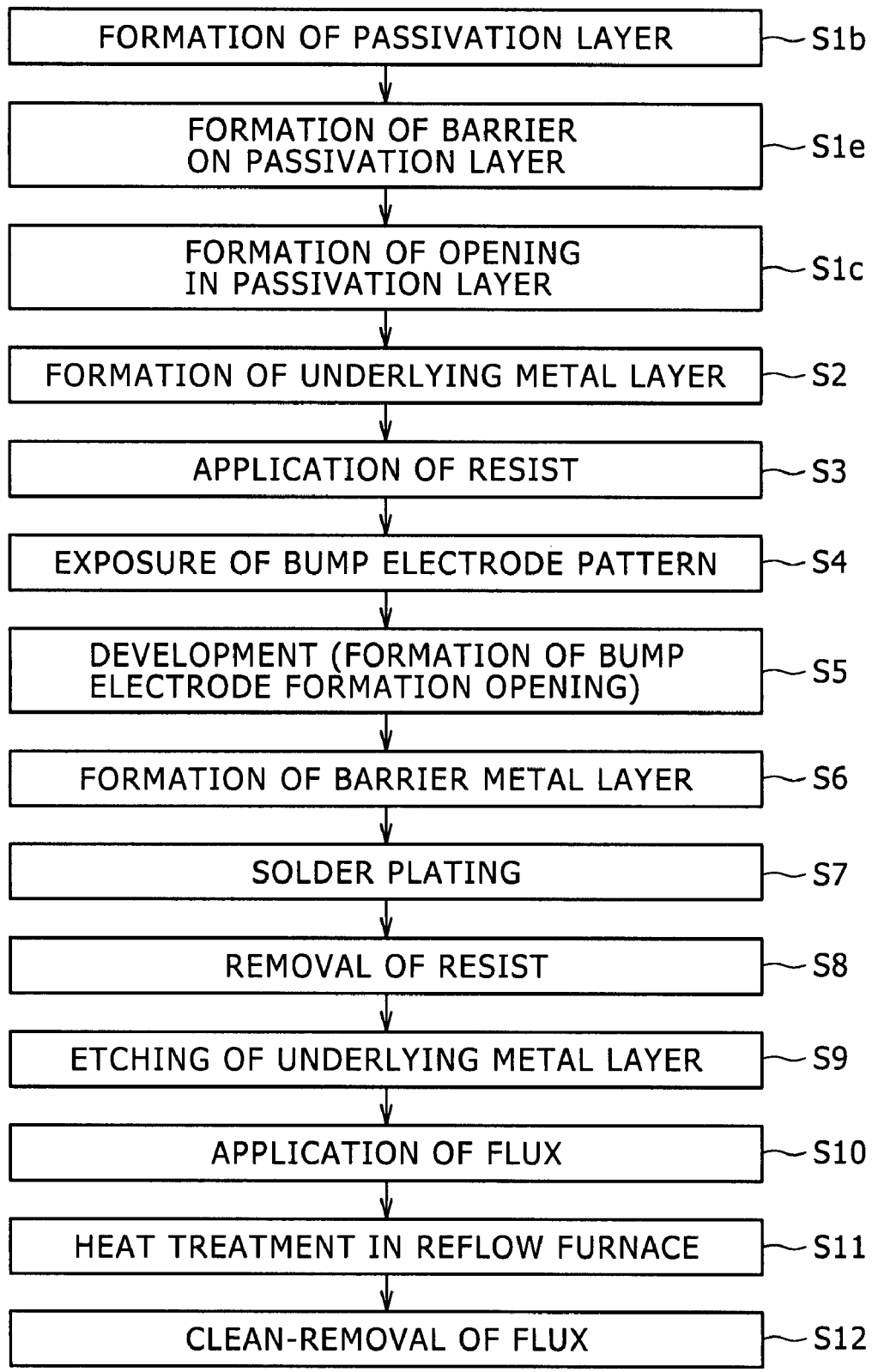
FIG. 9 is a flowchart for explaining the procedure of bump electrode formation according to a third embodiment of the invention, including formation of a barrier on a passivation layer.

FIG. 9 is a flowchart for explaining the procedure of the formation of a bump electrode 28 in the third embodiment, including the formation of the barrier 34 on the passivation layer 20.

FIGS. 10A to 10E are plan views and sectional views along the line Y-Y for explaining the procedure of the bump electrode formation in the present embodiment, including the formation of the barrier 34 on the passivation layer 20.

The respective steps shown in FIG. 9 will be described below with reference to FIG. 10. Note that explanation of the features in common with the first embodiment will be omitted because they have been already described above, and only different points will be explained in the following description.

S1b: Formation of a Passivation Layer

As shown in a plan view and a sectional view along the line Y-Y of FIG. 10A, similarly to the first embodiment, the pad electrode 14 (the shape thereof is the same as that in the first embodiment, but the diameter thereof is the same as that of the bump electrode 28) is formed on an insulating layer 12 deposited on a semiconductor substrate 10, and then the passivation layer 20 (formed of a silicon oxide film 16b and a silicon nitride film 18) is formed on the entire surface. In the present embodiment, the silicon oxide film 16b is formed of a CVD-SiO$_2$ film deposited by using plasma of which density is lower than that of HDP (e.g., TEOS/O$_2$-CVD film or SiH$_4$/N$_2$O-CVD film). Alternatively, the silicon oxide film 16b may be formed of an HDP-SiO$_2$ film similarly to the first embodiment.

S1e: Formation of a Barrier on the Passivation Layer

As shown in FIG. 10A, as the barrier ring 34, e.g. a projection insulating ring having a circular ring shape is formed by using photosensitive resin or the like. The barrier ring 34 has an outer diameter smaller than the diameter of the pad electrode 14 and has an inner diameter larger than the diameter of the opening 15a formed in the passivation layer 20 for exposure of a part of the pad electrode 14. The barrier ring 34, which is formed as a projection on the passivation layer 20, is to increase the length and area of the continuous part of the underlying metal layer and to suppress the influence of the occurrence of side etching. The barrier ring 34 may be formed of a conductive material, or alternatively may be formed of a silicon oxide, silicon nitride, or the like.

S1c: Formation of an Opening in the Passivation Layer

As shown in FIG. 10A, in the passivation layer 20 on the pad electrode 14, the opening 15a of which diameter is smaller than the inner diameter of the baring ring 34 and the diameter of the pad electrode 14 is formed. The orders of the steps S1e and S1c may be interchanged.

The steps subsequent to the step S1c in FIG. 9 are the same as the step S2 and the subsequent steps in FIG. 2.

As shown in a sectional view along the line Y-Y of FIG. 10B, in the step S2, an underlying metal layer 22 is formed on the entire surface. As a result, the underlying metal layer 22 is formed also on the surface of the step part formed of the projection as the barrier ring 34 formed on the passivation layer 20.

As shown in sectional views along the line Y-Y of FIGS. 10C, 10D, and 10E, the forming steps for the bump electrode 28 are completed through the steps S3 to S12, similarly to the first embodiment.

In the above-described procedure of the bump electrode formation in the present embodiment, a side-etched part 36 is generated similarly to the first and second embodiments. However, the underlying metal layer 22 that has the projection by the barrier ring 34 and hence a step is formed under a barrier metal layer 26. Thus, the area of the underlying metal layer 22 formed under the barrier metal layer 26 is larger than that in the related arts shown in FIGS. 15 to 18 (see the partially enlarged sectional view of FIGS. 10D and 10E).

Consequently, in the present embodiment, although the side-etched part 36 is generated in the removal of the unnecessary part of the underlying metal layer 22 by the wet etching, the area of the underlying metal layer 22 that remains under the barrier metal layer 26 without being side-etched is larger than that in the related arts, which offers the same advantages as those by the first embodiment.

An example of the sizes of the respective elements in the present embodiment, other than the sizes of the elements in common with the first embodiment, is as follows.

The pad electrode 14 has a thickness of 1 μm and has a regular octagonal shape circumscribing a circle having a diameter of 30 μm. The thickness of the passivation layer 20 is 1 μm. The diameter of the top part of the opening 15a is 24

μm. The inner diameter, outer diameter, and thickness (height) of the circular ring barrier 34 are 26 μm, 28 μm, and 1 μm, respectively.

FIGS. 11A to 11D are plan views and sectional views along the line Y-Y for explaining examples of the barrier 34 on the passivation layer 20 in the present embodiment. In the sectional views of FIG. 11, the sectional shapes of elements are represented as rectangular shapes for simplified illustration, similarly to FIG. 8.

FIG. 11A is obtained by representing the sectional shapes in FIG. 10A as rectangular shapes.

The examples shown in FIGS. 11B, 11C and 11D arise from changes of the shapes of the respective elements shown in FIG. 11A. Specifically, in these examples, the shapes of the opening 15a and the pad electrode 14 and the inner and outer shapes of the barrier ring 34 are square shapes, regular octagonal shapes, and circular shapes, respectively.

In the drawings used for the explanation of the present embodiment, the diameter of the pad electrode is the same as that of the bump electrode. However, these diameters do not need to be the same as long as the projection ring barrier is formed on the passivation layer outside the opening and at a position inside the projection of the bump electrode as described above. It will be obvious that the diameter of the pad electrode may be larger than that of the bump electrode.

Fourth Embodiment

In a fourth embodiment of the present invention, a bump electrode is formed after formation of plural barriers, such as double barriers, according to any of the first to third embodiments.

Figure 12A:
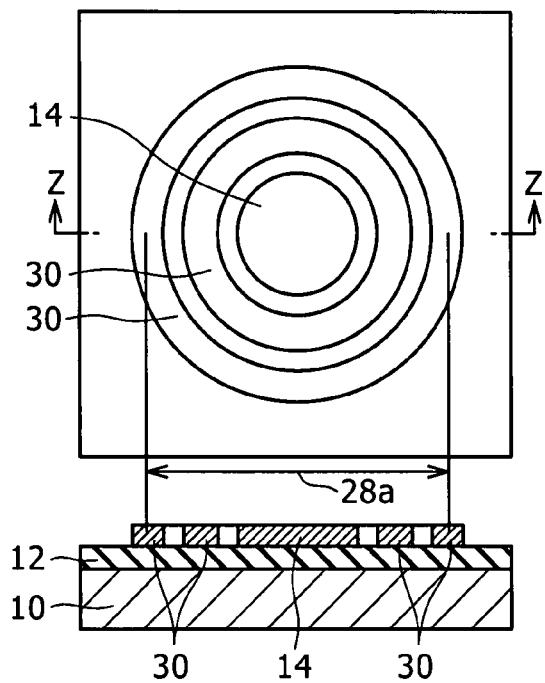
FIGS. 12A to 12C are diagrams for explaining modifications of formation of barriers according to a fourth embodiment of the invention.
Figure 12B:
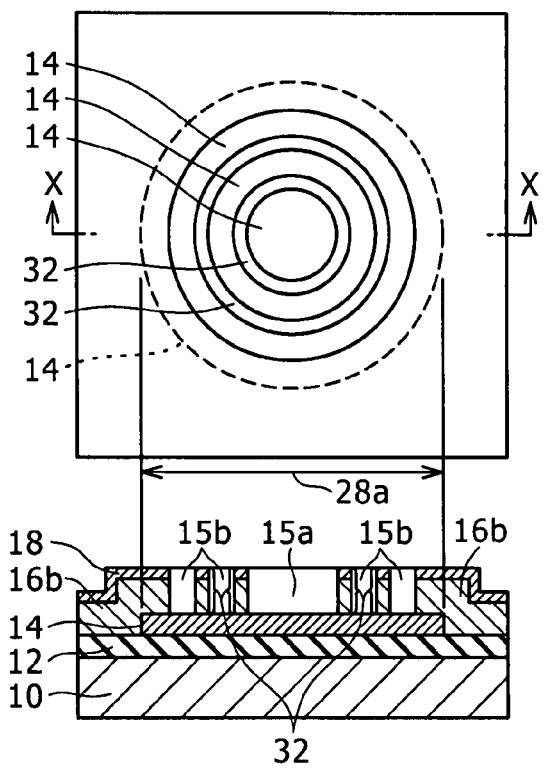
Figure 12C:
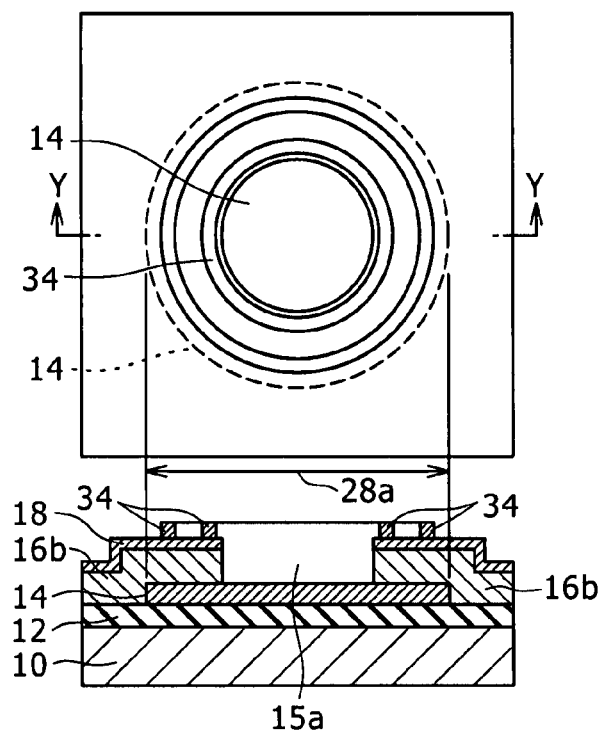

FIGS. 12A to 12C are diagrams for explaining modifications of formation of the barriers 30, 32 and 34 according to the fourth embodiment. FIG. 12A includes a plan view and a sectional view along the line Z-Z. FIG. 12B includes a plan view and a sectional view along the line X-X. FIG. 12C includes a plan view and a sectional view along the line Y-Y. In the sectional views of FIG. 12, the sectional shapes of elements are represented as rectangular shapes for simplified illustration, similarly to FIGS. 8 and 11.

The structure shown in FIG. 12A corresponds to a modification of the first embodiment. Specifically, in this example, the pad electrode 14 has a circular shape, and two circular barrier rings 30 that surround the circular pad electrode 14 and are separated from each other are formed. Furthermore, the opening 15a is formed to expose a part of the pad electrode 14.

The structure shown in FIG. 12B corresponds to a modification of the second embodiment. Specifically, in this example, the pad electrode 14 has a circular shape. On the circular pad electrode 14, the circular opening 15a that exposes a part of the pad electrode 14 and two circular barrier rings 32 that surround the opening 15a and are separated from each other are formed. Thus, the openings 15b separated from each other are formed to further expose a part of the pad electrode 14. The absent parts 30a may be formed in the barrier rings 30 like the examples shown in FIG. 5.

The structure shown in FIG. 12C corresponds to a modification of the third embodiment. Specifically, in this example, the pad electrode 14 has a circular shape, and the circular opening 15a that exposes a part of the circular pad electrode is formed. Furthermore, on the passivation layer 20 outside the opening 15a, two barrier rings 34 that surround the opening 15a and are separated from each other are formed.

In the present embodiment, the plural ring recesses formed between the plural ring barriers 30 and the pad electrode, the plural openings 15b formed by the plural barriers 32, and the plural barriers 34 are formed on a region over which the bump electrode 28 is to be formed, i.e., on a region inside the projection of the bump electrode 28. Furthermore, the underlying metal layer 22 is formed in a region including the projections or/and the recesses resulting from the formation of these barriers. The formation procedure for the barriers 30, 32, and 34 and the bump electrode 28 will be apparent from the above descriptions of the first to third embodiments.

In the present embodiment, similarly to the first to third embodiments, although the above-described side etching is caused at the time of removal of the unnecessary part of the underlying metal layer 22 by wet etching, a large bonding area between the underlying metal layer 22 and a barrier metal layer 26 can be ensured, which can offer enhanced reliability of the bonding between the underlying metal layer 22 and the barrier metal layer 26.

The barriers 30, 32 and 34, the openings 15a and 15b, the pad electrode 14, and so on may have any shape optionally.

Fifth Embodiment

In a fifth embodiment of the present invention, a bump electrode is formed after formation of double barriers as a combination of different types of barriers selected from the barriers 30, 32 and 34 according to the first to third embodiments.

Figure 13A:
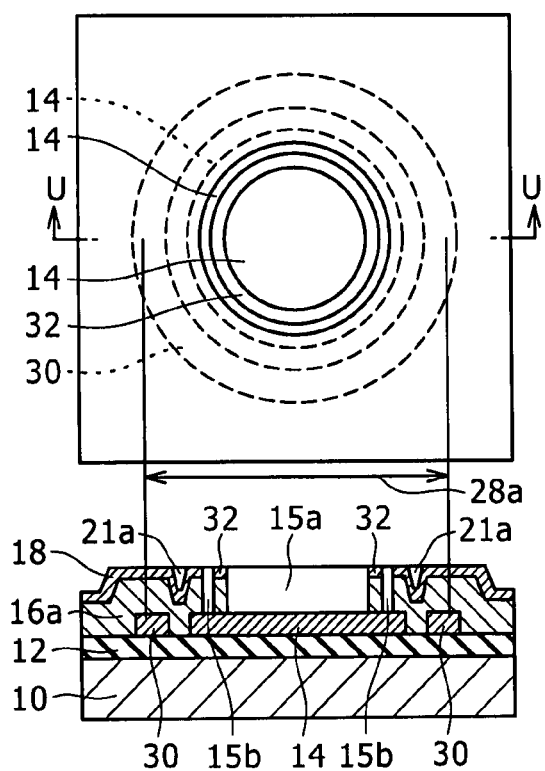
FIGS. 13A to 13C are diagrams for explaining modifications of formation of barriers according to a fifth embodiment of the invention.
Figure 13B:
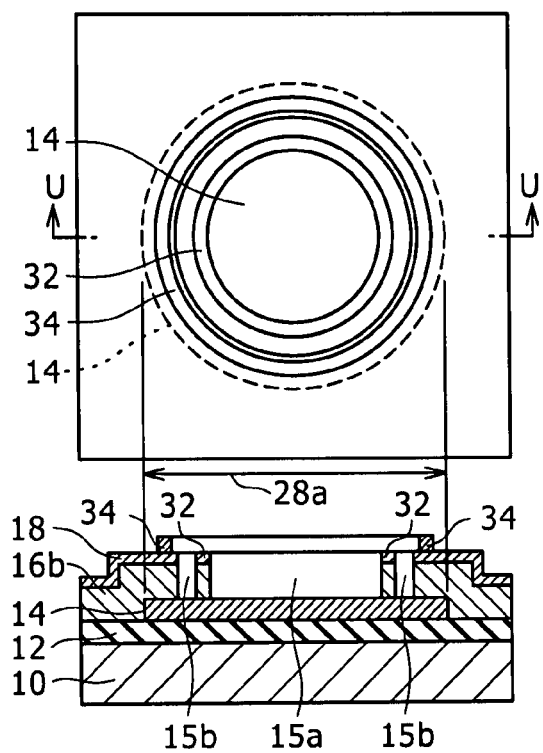
Figure 13C:
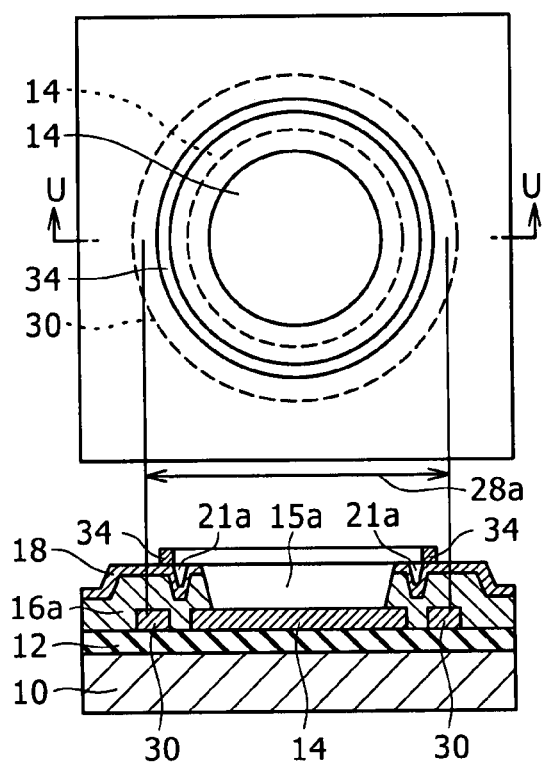

FIGS. 13A to 13C are plan views and sectional views along the line U-U for explaining modifications of formation of barriers according to the fifth embodiment. In the sectional views of FIG. 13, the sectional shapes of elements are represented as rectangular shapes for simplified illustration, similarly to FIGS. 8, 11 and 12.

The structure shown in FIG. 13A corresponds to a formation example in which the barrier 30 of the first embodiment is combined with the barrier 32 of the second embodiment.

The structure shown in FIG. 13B corresponds to a formation example in which the barrier 32 of the second embodiment is combined with the barrier 34 of the third embodiment.

The structure shown in FIG. 13C corresponds to a formation example in which the barrier 30 of the first embodiment is combined with the barrier 34 of the third embodiment.

Although the barriers 30, 32 and 34, the openings 15a and 15b, the pad electrode 14, and so on have a circular shape in the structures shown in FIG. 13, these elements may have any shape optionally. The formation procedure for the barriers 30, 32, and 34 and the bump electrode 28 will be apparent from the above descriptions of the first to third embodiments.

In the present embodiment, the ring recess formed between the ring barrier 30 and the pad electrode, the opening 15b formed by the barrier 32, and the barrier 34 are formed on a region over which the bump electrode 28 is to be formed, i.e., on a region inside the projection of the bump electrode. Furthermore, the underlying metal layer 22 is formed in a region including the projection or/and the recess resulting from the formation of these barriers.

In the present embodiment, similarly to the first to fourth embodiments, although the above-described side etching is caused at the time of removal of the unnecessary part of the underlying metal layer 22 by wet etching, a large bonding area between the underlying metal layer 22 and a barrier metal layer 26 can be ensured, which can offer enhanced reliability of the bonding between the underlying metal layer 22 and the barrier metal layer 26.

Comparison of Side Etching in Respective Embodiments

FIGS. 14A to 14F are sectional views along the line Z-Z for explaining a comparison of side etching in the respective embodiments of the present invention.

Figure 14A:
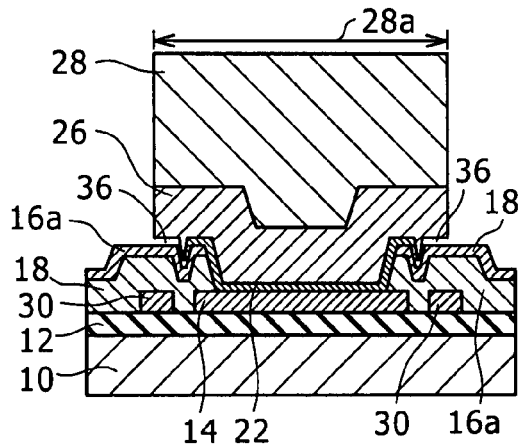
FIGS. 14A to 14F are diagrams for explaining comparison of side etching in the respective embodiments of the invention.
Figure 14B:
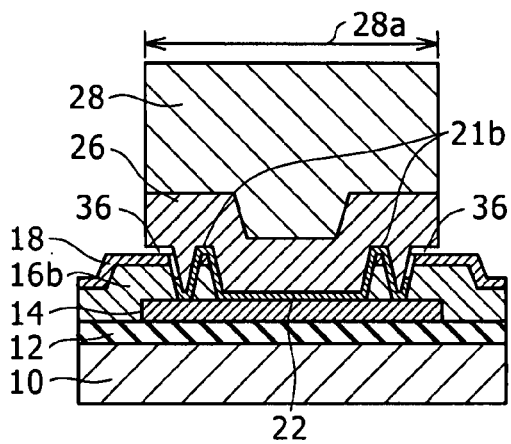
Figure 14C:
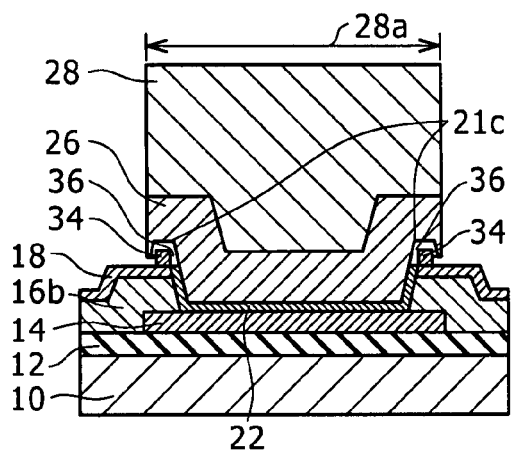

FIG. 14A shows the state of the occurrence of side etching in the first embodiment (see FIG. 4A). FIG. 14B shows the state of the occurrence of side etching in the second embodiment (see FIG. 7D). FIG. 14C shows the state of the occurrence of side etching in the third embodiment (see FIG. 10D). FIG. 14F shows the state of the occurrence of side etching in a related art (see FIG. 18D).

Figure 14D:
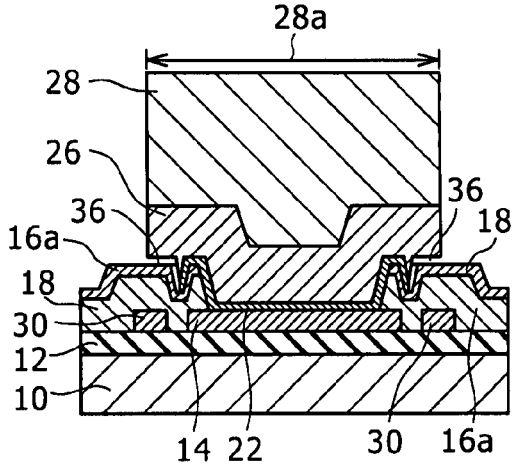
Figure 14E:
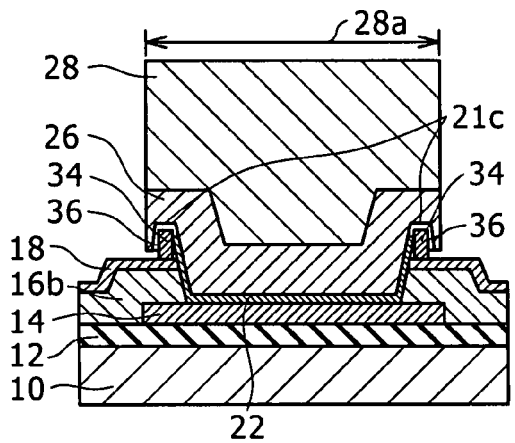
Figure 14F:
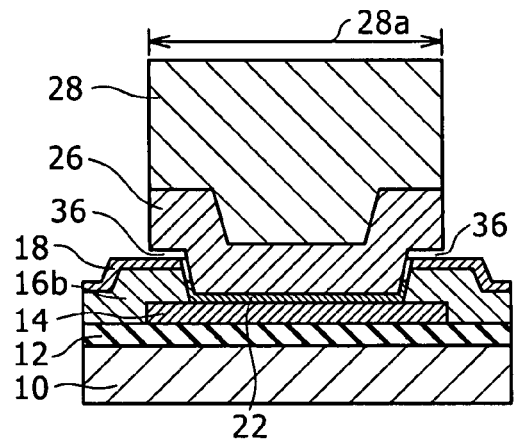
Figure 15A:
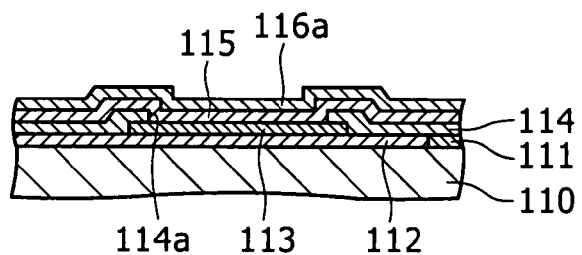
FIGS. 15A to 15E are diagrams for explaining a method for forming a bump electrode in a related art.
Figure 15B:
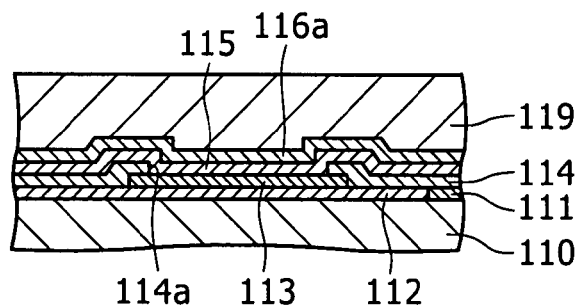
Figure 15C:
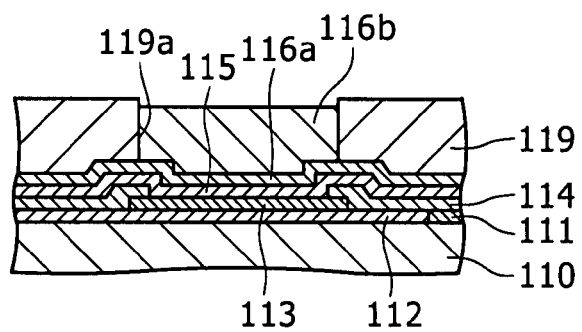
Figure 15D:
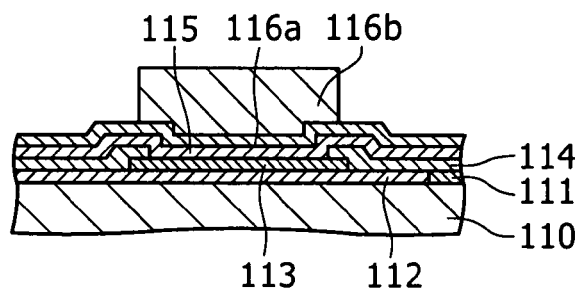
Figure 15E:
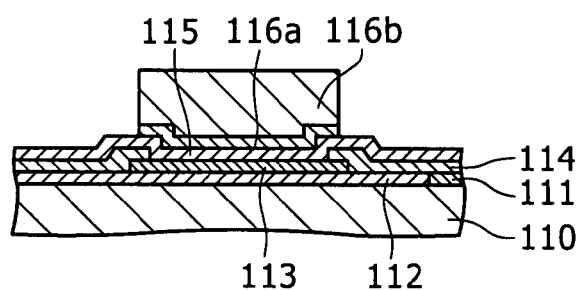
Figure 16A:
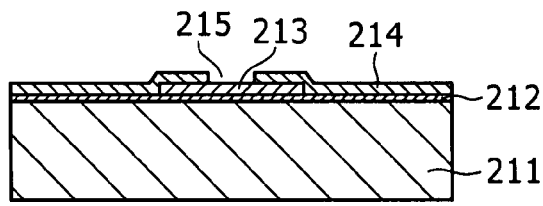
FIGS. 16A to 16F are diagrams for explaining a method for forming a bump electrode in a related art.
Figure 16D:
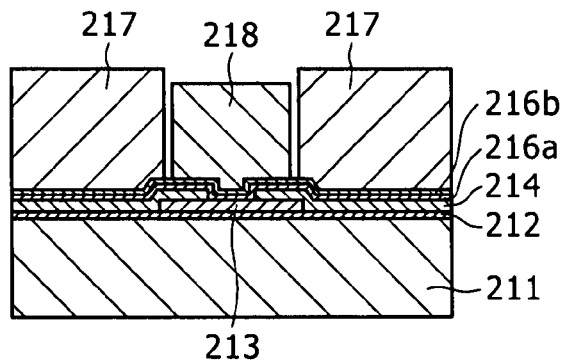
Figure 16B:
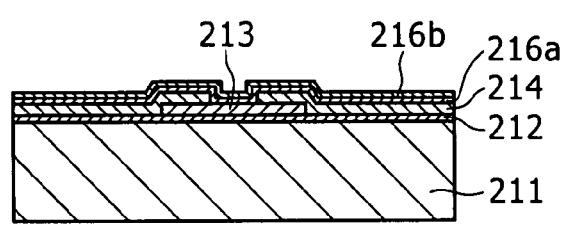
Figure 16E:
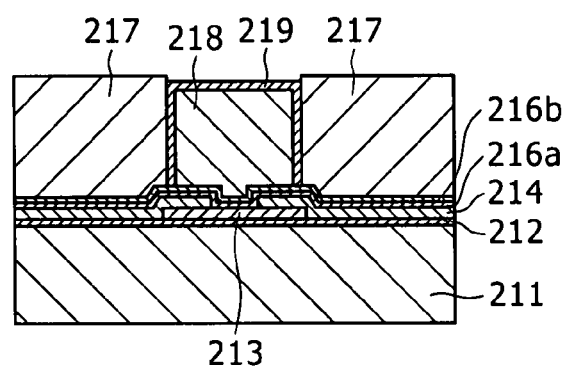
Figure 16C:
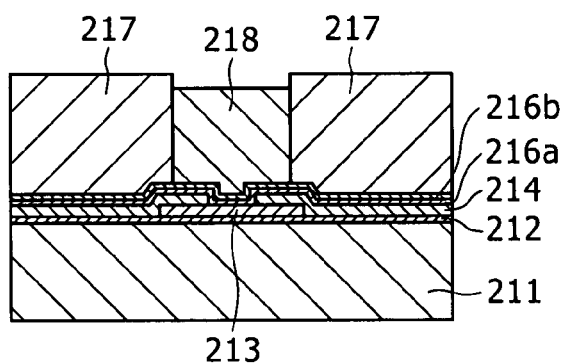
Figure 16F:
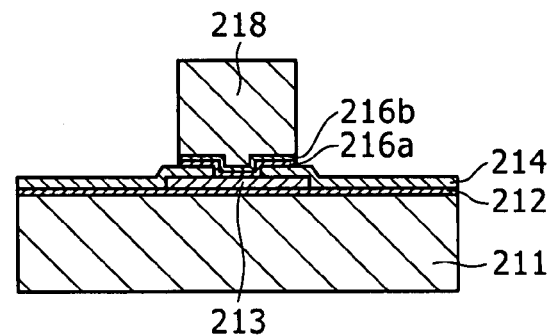
Figure 17A:
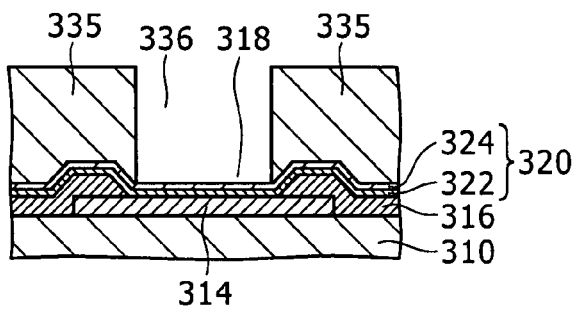
FIGS. 17A to 17G are diagrams for explaining a method for forming a bump electrode in a related art.
Figure 17E:
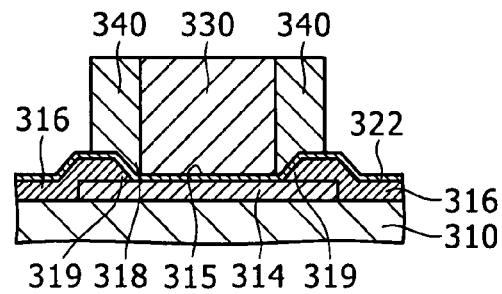
Figure 17B:
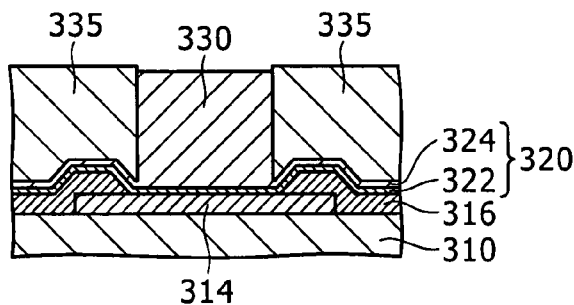
Figure 17F:
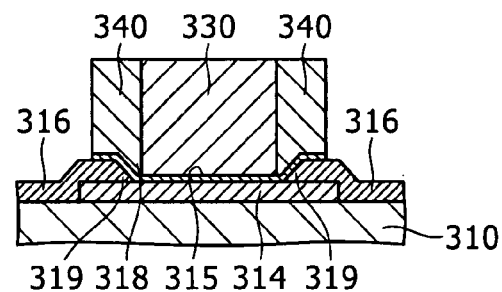
Figure 17C:
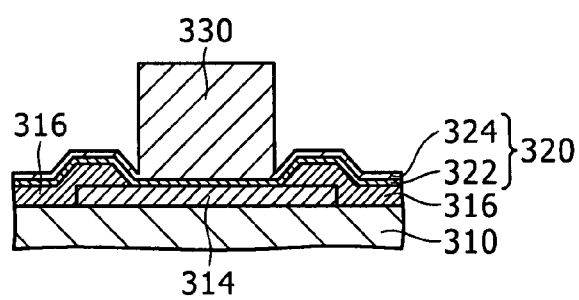
Figure 17G:
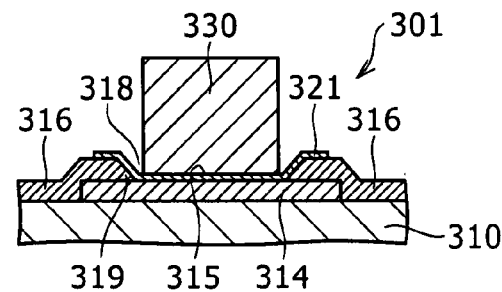
Figure 17D:
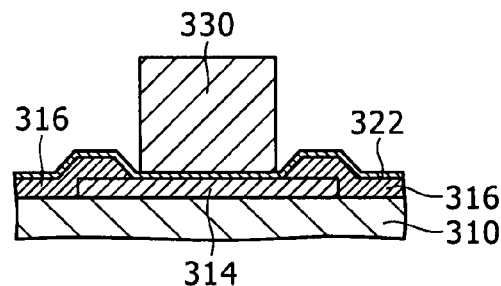
Figure 18A:
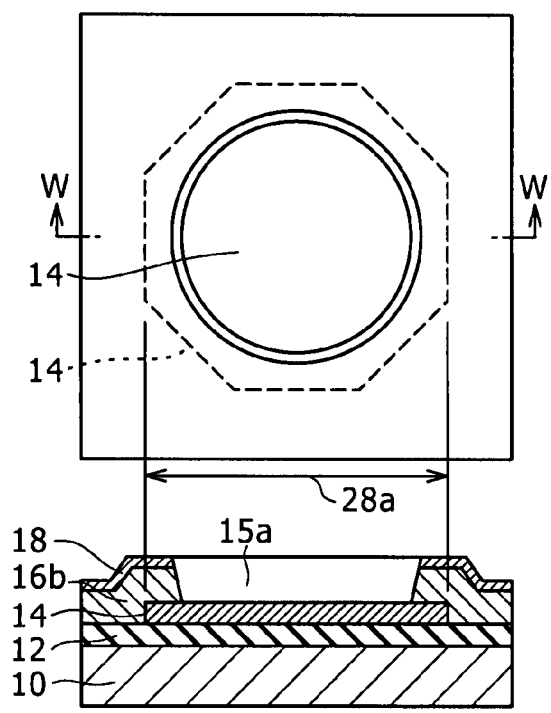
FIGS. 18A to 18E are diagrams for explaining forming steps for a bump electrode and the occurrence of side etching in a related art.
Figure 18D:
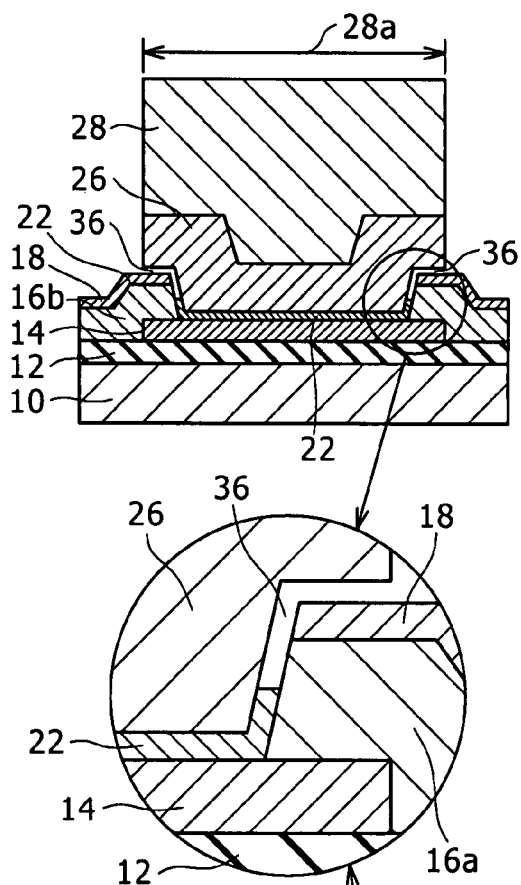
Figure 18B:
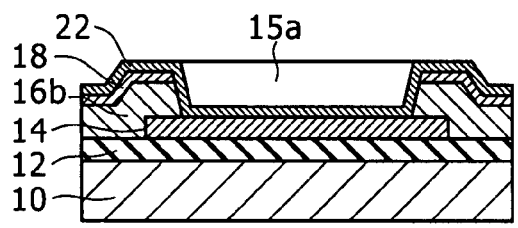
Figure 18C:
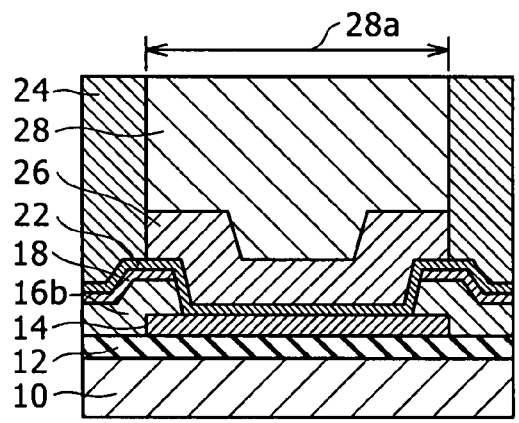
Figure 18E:
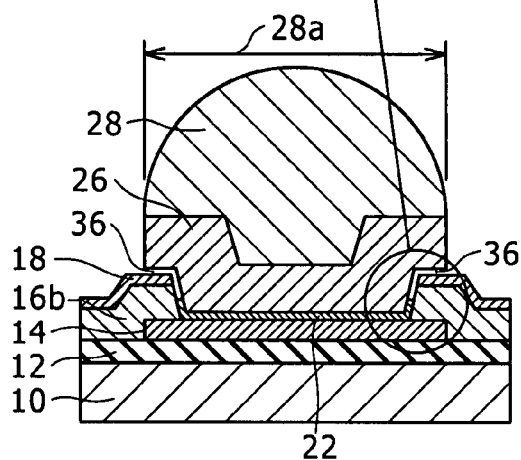

FIG. 14D shows the state of the occurrence of side etching in another example of the first embodiment in which the distance between the pad electrode 14 and the barrier ring 30 is larger compared with the example of FIG. 14A. In the example of FIG. 14D, the bonding area between the underlying metal layer 22 and the barrier metal layer 26 is larger than that in the example of FIG. 14A, and hence the influence of the side etching is smaller than that in the example of FIG. 14A. FIG. 14E shows the state of the occurrence of side etching in another example of the third embodiment in which the height of the barrier 34 is larger compared with the example of FIG. 14C. In the example of FIG. 14E, the bonding area between the underlying metal layer 22 and the barrier metal layer 26 is larger than that in the example of FIG. 14C, and hence the influence of the side etching is smaller than that in the example of FIG. 14C.

Comparison between the above-described embodiments and the related art will be made below based on examples of the sizes of the respective elements in the embodiments and the related art. Specifically, comparison will be made between the lengths of the bonding part between the barrier metal layer 26 and the underlying metal layer 22 that remains without being side-etched, in the examples of FIGS. 14A, 14B and 14C, and the length of the bonding part between the barrier metal layer 26 and the underlying metal layer 22 that remains without being side-etched, in the example of FIG. 14F. Moreover, comparison will be made between the areas of the bonding part between the barrier metal layer 26 and the underlying metal layer 22 that remains without being side-etched, in the examples of FIGS. 14A, 14B and 14C, and the area of the bonding part between the barrier metal layer 26 and the underlying metal layer 22 that remains without being side-etched, in the example of FIG. 14F.

The sizes of the respective elements in the related art shown in the sectional view of FIG. 14F are as follows.

The pad electrode 14 is an Al layer that has a thickness of 1 μm and has the shape of a circle having a diameter of 30 μm. The thickness of the passivation layer 20 formed on the pad electrode 14 is 1 μm. The thickness of the underlying metal layer 22 is 0.05 μm. The diameter of the top part of the opening in the passivation layer 20 is 24 μm. The diameter of the top part of the bump electrode formation opening is 30 μm, and therefore the bump electrode diameter 28a is 30 μm. The thickness of the barrier metal layer 26 is 5 μm.

When it is assumed that the opening in the passivation layer 20 has a rectangular sectional shape and the thickness of the underlying metal layer 22 can be ignored, the length of the ideal bonding part between the underlying metal layer 22 and the barrier metal layer 26, obtained when the underlying metal layer 22 is not side-etched at all, is 32 μm. If the length of the side-etched part of the underlying metal layer 22 when viewed in the sectional view (referred to simply as "sectional length", hereinafter) is 3.5 μm, the length of the bonding part that remains without being side-etched, shown in the sectional view of FIG. 14F, is 28.5 μm.

Furthermore, if the sectional length of the side-etched part of the underlying metal layer 22 is 3.5 μm, the area of the bonding part that remains without being side-etched shown in FIG. 14F is 489.8 (μm)$^2$. The area of the ideal bonding part between the underlying metal layer 22 and the barrier metal layer 26, obtained when the underlying metal layer 22 is not side-etched at all, is 781.9 (μm)$_2$.

The sizes of the respective elements in the sectional view of FIG. 14A are as follows.

The pad electrode 14 is an Al layer that has a thickness of 1 μm and has the shape of a circle having a diameter of 22 μm. The barrier ring 30 is an Al layer that has a thickness of 1 μm and has a ring shape formed of a first circle having a diameter of 26 μm and a second circle having a diameter of 34 μm. Accordingly, the length of the gap between the pad electrode 14 and the barrier ring 30 is 2 μm. The total thickness of the HDP-silicon oxide film 16a and the silicon nitride film 18 formed over the pad electrode 14, i.e., the thickness of the passivation layer 20, is 1 μm. The thickness of the underlying metal layer 22 is 0.05 μm.

The diameter of the top part of the opening 15a is 18 μm. The diameter of the top part of the opening 15c is 30 μm, and therefore the bump electrode diameter 28a is 30 μm. The thickness of the barrier metal layer 26 is 5 μm.

When it is assumed that the opening in the passivation layer 20 has a rectangular sectional shape and the thickness of the underlying metal layer 22 can be ignored, the length of the ideal bonding part between the underlying metal layer 22 and the barrier metal layer 26, obtained when the underlying metal layer 22 is not side-etched at all, is 33.6 μm. Furthermore, if the sectional length of the side-etched part of the underlying metal layer 22 is 3.5 μm, which is the same as the length in the example of FIG. 14F, the length of the bonding part that remains without being side-etched shown in FIG. 14A is 30.1 μm. This length is 1.06 (=30.1/28.5) times the length in the example of FIG. 14F.

Furthermore, if the sectional length of the side-etched part of the underlying metal layer 22 is 3.5 μm, which is the same as the length in the example of FIG. 14F, the area of the bonding part that remains without being side-etched shown in FIG. 14A is 529.9 (μm)$^2$. This area of the remaining bonding part is 1.08 (=529.9/489.8) times the area in the example of FIG. 14F. That is, the bonding area is larger by about 10% compared with the related art shown in FIG. 14F. In the example of FIG. 14A, the area of the ideal bonding part between the underlying metal layer 22 and the barrier metal layer 26, obtained when the underlying metal layer 22 is not side-etched at all, is 768.3 (μm)$^2$.

Comparison will be made regarding another example according to the first embodiment in which the diameter of the pad electrode 14 is set to 14 μm and the following two barrier rings are formed like in the example of FIG. 12A: the first barrier ring 30 having an inner diameter of 18 μm and an outer diameter of 22 μm; and the second barrier ring 30 having an inner diameter of 26 μm and an outer diameter of 34 μm (the length of the gap between these two barrier rings is 2 μm, and the length of the gap between the inside barrier ring 30 and the pad electrode 14 is 2 μm). In this example, the length of the ideal bonding part between the underlying metal layer 22 and the barrier metal layer 26, obtained when the underlying metal layer 22 is not side-etched at all, is 35.2 μm. If the sectional length of the side-etched part of the underlying metal layer 22 is 3.5 μm, which is the same as the length in the example of FIG. 14F, the length of the bonding part that remains without being side-etched is 31.7 μm. This length is 1.11 (=31.7/28.5) times the length in the example of FIG. 14F.

Furthermore, if the sectional length of the side-etched part of the underlying metal layer 22 is 3.5 μm, which is the same as the length in the example of FIG. 14F, the area of the bonding part that remains without being side-etched is 571.1 (μm)². This area of the remaining bonding part is 1.17 (=571.1/489.8) times the area in the example of FIG. 14F. That is, the bonding area is larger by about 20% compared with the related art shown in FIG. 14F. In this example, the area of the ideal bonding part between the underlying metal layer 22 and the barrier metal layer 26, obtained when the underlying metal layer 22 is not side-etched at all, is 809.5 (μm)².

The sizes of the respective elements in the example shown in the sectional view of FIG. 14B are as follows (the sizes of the elements in common with the example of FIG. 14A are not shown).

The pad electrode 14 has a thickness of 1 μm and has the shape of a circle having a diameter of 30 μm. The thickness of the passivation layer 20 is 1 μm. The diameter of the top part of the first opening 15a is 18 μm. The inner diameter and outer diameter of the top part of the second opening 15b are 20 μm and 24 μm, respectively.

When it is assumed that the opening in the passivation layer 20 has a rectangular sectional shape and the thickness of the underlying metal layer 22 can be ignored, the length of the ideal bonding part between the underlying metal layer 22 and the barrier metal layer 26, obtained when the underlying metal layer 22 is not side-etched at all, is 36.0 μm. If the sectional length of the side-etched part of the underlying metal layer 22 is 3.5 μm, which is the same as the length in the example of FIG. 14F, the length of the bonding part that remains without being side-etched shown in FIG. 14B is 32.5 μm. This length is 1.14 (=32.5/28.5) times the length in the example of FIG. 14F.

Furthermore, if the sectional length of the side-etched part of the underlying metal layer 22 is 3.5 μm, which is the same as the length in the example of FIG. 14F, the area of the bonding part that remains without being side-etched shown in FIG. 14B is 609.2 (μm)². This area of the remaining bonding part is 1.24 (=609.2/489.8) times the area in the example of FIG. 14F. That is, the bonding area is larger by about 20% or more compared with the related art shown in FIG. 14F. In the example of FIG. 14B, the area of the ideal bonding part between the underlying metal layer 22 and the barrier metal layer 26, obtained when the underlying metal layer 22 is not side-etched at all, is 901.2 (μm)².

Comparison will be made regarding another example according to the second embodiment in which the diameter of the top part of the first opening 15a is set to 12 μm and two barrier rings 32 are formed like in the example of FIG. 12B through addition of the barrier ring 32 that yields the second opening 15b of which top part has an inner diameter of 14 μm and an outer diameter of 18 μm (the width of this opening 15b is 2 μm). In this example, the length of the ideal bonding part between the underlying metal layer 22 and the barrier metal layer 26, obtained when the underlying metal layer 22 is not side-etched at all, is 40.0 μm. If the sectional length of the side-etched part of the underlying metal layer 22 is 3.5 μm, which is the same as the length in the example of FIG. 14F, the length of the bonding part that remains without being side-etched is 36.5 μm. This length is 1.28 (=36.5/28.5) times the length in the example of FIG. 14F.

Furthermore, if the sectional length of the side-etched part of the underlying metal layer 22 is 3.5 μm, which is the same as the length in the example of FIG. 14F, the area of the bonding part that remains without being side-etched is 690.8 (μm)². This area of the remaining bonding part is 1.41 (=690.8/489.8) times the area in the example of FIG. 14F. That is, the bonding area is larger by about 40% compared with the related art shown in FIG. 14F. In this example, the area of the ideal bonding part between the underlying metal layer 22 and the barrier metal layer 26, obtained when the underlying metal layer 22 is not side-etched at all, is 982.8 (μm)².

The sizes of the respective elements in the example shown in the sectional view of FIG. 14C are as follows (the sizes of the elements in common with the example of FIG. 14A are not shown).

The pad electrode 14 has a thickness of 1 μm and has the shape of a circle having a diameter of 30 μm. The thickness of the passivation layer 20 is 1 μm. The diameter of the top part of the opening 15a is 24 μm. The inner diameter, outer diameter, and thickness (height) of the circular ring barrier 34 are 26 μm, 28 μm, and 1 μm, respectively.

When it is assumed that the opening in the passivation layer 20 has a rectangular sectional shape and the thickness of the underlying metal layer 22 can be ignored, the length of the ideal bonding part between the underlying metal layer 22 and the barrier metal layer 26, obtained when the underlying metal layer 22 is not side-etched at all, is 36.0 μm. If the sectional length of the side-etched part of the underlying metal layer 22 is 3.5 μm, which is the same as the length in the example of FIG. 14F, the length of the bonding part that remains without being side-etched shown in FIG. 14C is 32.5 μm. This length is 1.14 (=32.5/28.5) times the length in the example of FIG. 14F.

Furthermore, if the sectional length of the side-etched part of the underlying metal layer 22 is 3.5 μm, which is the same as the length in the example of FIG. 14F, the area of the bonding part that remains without being side-etched shown in FIG. 14C is 646.8 (μm)². This area of the remaining bonding part is 1.32 (=646.8/489.8) times the area in the example of FIG. 14F. That is, the bonding area is larger by about 30% or more compared with the related art shown in FIG. 14F. In the example of FIG. 14C, the area of the ideal bonding part between the underlying metal layer 22 and the barrier metal layer 26, obtained when the underlying metal layer 22 is not side-etched at all, is 951.4 (μm)².

Comparison will be made regarding another example according to the third embodiment in which the diameter of the top part of the opening 15a is 24 μm and the following two barrier rings are formed like in the example of FIG. 12C with the intermediary of a 0.5-μm gap therebetween: the first circular barrier ring 34 having an inner diameter of 24 μm and an outer diameter of 26 μm; and the second circular barrier ring 34 having an inner diameter of 27 μm and an outer diameter of 29 μm (both the width and thickness (height) of these barrier rings are 1 μm). In this example, the length of the ideal bonding part between the underlying metal layer 22 and the barrier metal layer 26, obtained when the underlying metal layer 22 is not side-etched at all, is 40.0 μm. If the sectional length of the side-etched part of the underlying metal layer 22 is 3.5 μm, which is the same as the length in the example of FIG. 14F, the length of the bonding part that remains without being side-etched is 36.5 μm. This length is 1.28 (=36.5/28.5) times the length in the example of FIG. 14F.

Furthermore, if the sectional length of the side-etched part of the underlying metal layer 22 is 3.5 μm, which is the same as the length in the example of FIG. 14F, the area of the bonding part that remains without being side-etched is 804.6 (μm)². This area is 1.64 (=804.6/489.8) times the area in the example of FIG. 14F. That is, the bonding area is larger by about 60% or more compared with the related art shown in FIG. 14F. In this example, the area of the ideal bonding part between the underlying metal layer 22 and the barrier metal layer 26, obtained when the underlying metal layer 22 is not side-etched at all, is 1114.7 $(\mu m)^2$.

As described above in the explanation of the respective embodiments, without a great change of the bump formation steps, the influence of the above-described side etching caused at the time of removal of the unnecessary part of the underlying metal layer 22 by wet etching can be reduced through increasing of the area of the underlying metal layer 22 formed under the barrier metal layer 26. This can enhance the bonding strength between the bump electrode 28 and the semiconductor substrate 10, dependent upon the barrier metal layer 26 and the underlying metal layer 22. Consequently, the yield and reliability can be enhanced. Moreover, the diameter and pitch of the bump electrodes can be decreased, which can enhance the integration degree and performance of LSIs in an SiP based on chip-on-chip connection.

In the respective embodiments, the pad electrode 14 is formed of a metal such as Al, Cu, Au or an Al alloy typified by an Al—Cu alloy and Al—Si alloy. The pad electrode 14 is electrically connected to any of active elements such as transistors and passive elements such as resistors, inductors, and capacitors that are formed inside the semiconductor substrate 10 and are not shown in the drawings. Alternatively, the pad electrode 14 may be electrically independent without being connected to these elements.

Furthermore, in the respective embodiments, the passivation layer 20 is formed of an insulator such as $SiO_2$ or $Si_3N_4$ or an insulating resin such as polyimide. In the first embodiment, the passivation layer 20 includes at least one HDP-$SiO_2$ layer.

In addition, in the respective embodiments, it is preferable that the underlying metal layer 22 and the barrier metal layer 26 be formed of a metal such as Ti, Cu, W, Cr, Pt, Au, Pd, or Ni, a multilayer film of a nitride of any of these metals, or an alloy of any of these metals. For example, the underlying metal layer 22 is formed by depositing a Ti film and a Cu film in that order on an Al pad (pad electrode 14), and a Ni film can be selected as the barrier metal layer 26.

Moreover, in the respective embodiments, the bump electrode 28 formed through electrolytic plating can be formed by using solder containing Pb or any of the following metals: Sn, Sn—Ag, Sn—Cu, Sn—Au, Sn—Bi, Sn—In, Sn—Zn, Sn—Sb, Sn—Ag—Cu, Sn—Ag—Sb, Sn—Ag—Cu—Sb, Sn—Ag—Bi, Sn—Bi—In, Sn—Bi—Zn, Sn—Zn—In—Bi, Cu, In, Bi—In, In—Au, In—Ag, Au—Ge, and Au. As the shape of the bump electrode 28, besides a spherical crown shape, e.g. a circular cylinder shape and a polygonal cylinder shape are also available. As the method of reflow, a method in which flux is not used may be used. For example, reflow in which a reduction atmosphere such as plasma or/and radical containing $H_2$ is employed may be used.

In the above-described examples, a bump electrode is formed over a semiconductor substrate such as a Si substrate (a wafer-level process (WLP) can be employed for these examples). However, it is also possible to form a bump electrode over a substrate composed of an organic or inorganic electrically insulating material or over a mounding substrate (interposer substrate). Electronic components as a semiconductor chip or mounting substrate over which a bump electrode is thus formed are connected by CoC mounting, so that a multi-chip module is formed.

This is the end of the description of embodiments of the present invention. It should be obvious that the present invention is not limited to the above-described embodiments but various modifications can be made based on the technical idea of the invention. For example, it is also possible to combine the above-described recess and projection.

As described above, embodiments of the present invention can prevent the lowering of the bonding strength between a bump electrode and a semiconductor substrate to thereby provide an electronic component having a bump electrode that allows highly reliable electric connection. The embodiments can provide also a semiconductor device employing the electronic component and a method for manufacturing an electronic component.

What is claimed is:

1. An electronic component comprising;
  a plurality of pad electrodes, wherein an underlying metal layer is formed over each pad electrode and extends over a portion of a passivation layer and a barrier metal layer is formed over the underlying metal layer;
  wherein the underlying metal layer beneath an outer region of the barrier metal layer has a first portion that extends upward from the pad electrode and a second portion that extends laterally away from a center of the pad electrode and a third portion that extends downward from the second portion, the underlying metal layer following a contour of the passivation layer, and
  further comprising a barrier structure substantially surrounding the pad electrode and being formed in a same layer as the pad electrode and wherein the passivation layer is formed over the barrier structure and an outer perimeter of the pad electrode.

2. A method for manufacturing an electronic component, comprising:
  forming a passivation layer with an opening that exposes at least a part of a pad electrode,
  forming an underlying metal layer on the pad electrode and a portion of the passivation layer, and forming a barrier metal layer on the underlying metal layer for an external connection electrode;
  forming a recess or/and a projection under the barrier metal layer outside or/and inside the opening in a peripheral region of barrier metal layer; and
  wherein the underlying metal layer is formed on the recess or/and the projection so that the underlying metal layer has a surface shape that follows the recess or/and the projection, and further comprising forming a barrier structure substantially surrounding the pad electrode in a same layer as the pad electrode and wherein the passivation layer is formed over the barrier structure and an outer perimeter of the pad electrode.

* * * * *